(12) United States Patent
Furuta et al.

(10) Patent No.: US 11,831,254 B2
(45) Date of Patent: Nov. 28, 2023

(54) VIBRATOR, VIBRATION WAVE DRIVE DEVICE, VIBRATION WAVE MOTOR, AND ELECTRONICAL DEVICE

(71) Applicant: CANON KABUSHIKI KAISHA, Tokyo (JP)

(72) Inventors: Tatsuo Furuta, Machida (JP); Takayuki Watanabe, Yokohama (JP); Miki Ueda, Tokyo (JP); Shinya Koyama, Tokyo (JP); Makoto Kubota, Yokohama (JP); Takanori Matsuda, Chofu (JP); Akira Uebayashi, Tokyo (JP); Jumpei Hayashi, Yokohama (JP); Hitoshi Nishitani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1163 days.

(21) Appl. No.: 16/473,154

(22) PCT Filed: Dec. 21, 2017

(86) PCT No.: PCT/JP2017/045990
§ 371 (c)(1),
(2) Date: Jun. 24, 2019

(87) PCT Pub. No.: WO2018/123819
PCT Pub. Date: Jul. 5, 2018

(65) Prior Publication Data
US 2019/0334458 A1    Oct. 31, 2019

(30) Foreign Application Priority Data

Dec. 27, 2016  (JP) .................................. 2016-254371
Dec. 8, 2017   (JP) .................................. 2017-236227

(51) Int. Cl.
*H02N 2/02*    (2006.01)
*G02B 7/04*    (2021.01)
(Continued)

(52) U.S. Cl.
CPC ............... *H02N 2/026* (2013.01); *G02B 7/04* (2013.01); *H02N 2/065* (2013.01);
(Continued)

(58) Field of Classification Search
None
See application file for complete search history.

(56) References Cited

U.S. PATENT DOCUMENTS 6,461,532 B1 * 10/2002 Oka ...................... C04B 35/475
501/134
2006/0175929 A1    8/2006 Sawada
(Continued)

FOREIGN PATENT DOCUMENTS

CN    1943101 A    4/2007
EP    1075079 A1   2/2001
(Continued)

OTHER PUBLICATIONS

Jiamei Jin, et al.,"A linear ultrasonic motor using (K0.5Na0.5)NbO3 based lead-free piezoelectric ceramics", Sensors and Actuators A: Physical, vol. 165 (2011), No. 2, pp. 410-414.

*Primary Examiner* — Erica S Lin
(74) *Attorney, Agent, or Firm* — Canon U.S.A., Inc., IP Division

(57) ABSTRACT

The present invention provides a vibrator made of a non-lead-based piezoelectric material and capable of being driven at a sufficient speed with low power consumption, and provides a vibration wave drive device and an electronical device each using the vibrator. To that end, the vibrator according to the present invention includes a piezoelectric element including a piezoelectric material and electrodes, and an elastic body, wherein a Pb component contained in the piezoelectric material is less than 1000 ppm, and a resonance frequency $f_A$ in a vibration mode A and a resonance frequency $f_B$ in a vibration mode B satisfy a relation
(Continued)

of an absolute value of $(f_B-f_A)>2$ (kHz), the vibration mode A and the vibration mode B generating vibration waves in the elastic body with wave fronts of the vibration waves intersecting each other.

11 Claims, 6 Drawing Sheets

(51) Int. Cl.
*H02N 2/06* (2006.01)
*H10N 30/853* (2023.01)

(52) U.S. Cl.
CPC ..... *H10N 30/8536* (2023.02); *H10N 30/8542* (2023.02); *H10N 30/8561* (2023.02)

(56) References Cited

U.S. PATENT DOCUMENTS

2011/0057543 A1* 3/2011 Adachi ................. H02N 2/103
 310/323.02
2011/0291525 A1 12/2011 Maruyama
2012/0146459 A1 6/2012 Kojima
2013/0057110 A1* 3/2013 Aoyagi .................... H01G 7/02
 310/300
2014/0084750 A1* 3/2014 Shimada ................. B08B 7/028
 310/311
2014/0290828 A1* 10/2014 Zhang .................... B41J 2/1629
 156/247

FOREIGN PATENT DOCUMENTS

| JP | 2006-254683 A | 9/2006 |
| JP | 2006340493 A | 12/2006 |
| JP | 2007-137764 A | 6/2007 |
| JP | 2009-215111 A | 9/2009 |
| JP | 2012-231622 A | 11/2012 |
| JP | 2013-219316 A | 10/2013 |
| JP | 2015-10006 A | 1/2015 |
| WO | 2013/005701 A1 | 1/2013 |
| WO | 2017/164413 A1 | 9/2017 |

* cited by examiner

[Fig. 1A]
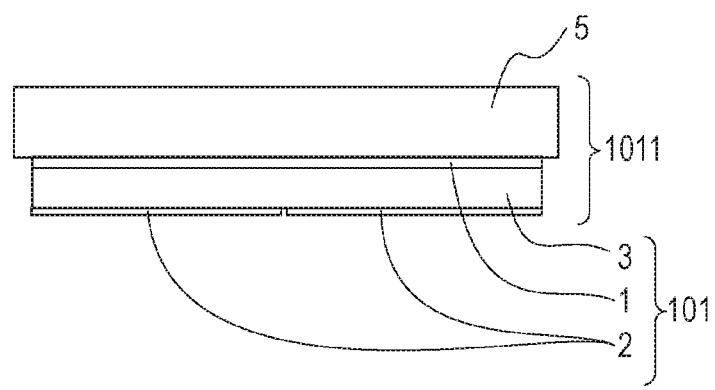
[Fig. 1B]
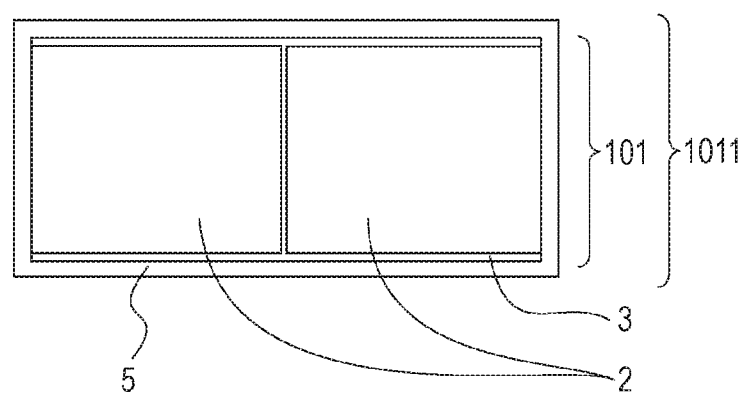

[Fig. 2A]
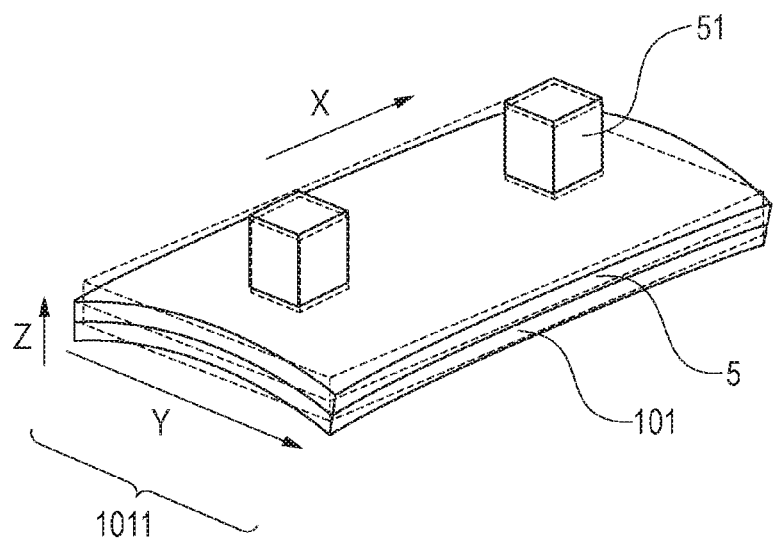
[Fig. 2B]
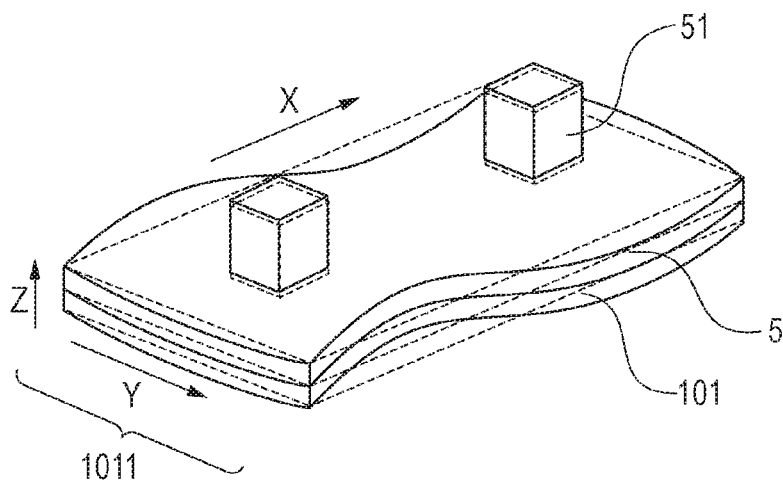
[Fig. 3A]
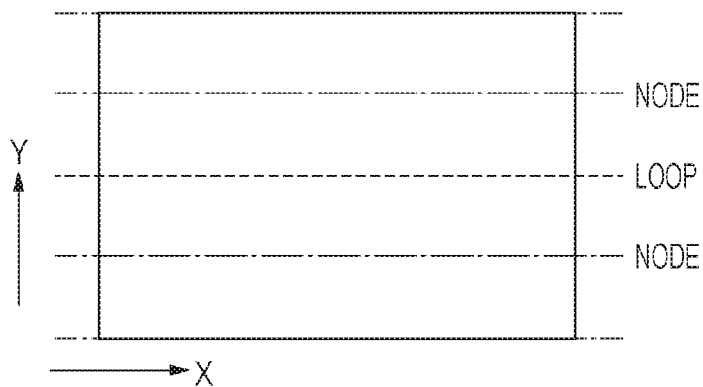

[Fig. 3B]
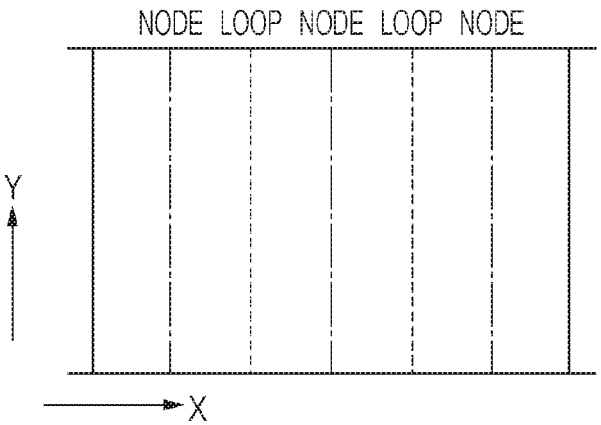
[Fig. 3C]
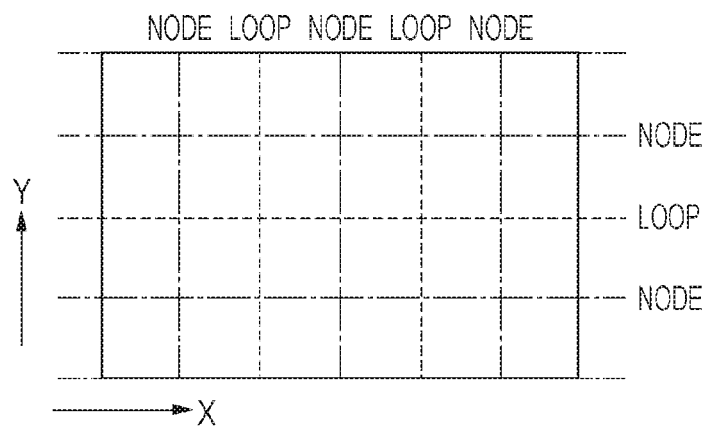
[Fig. 4A]
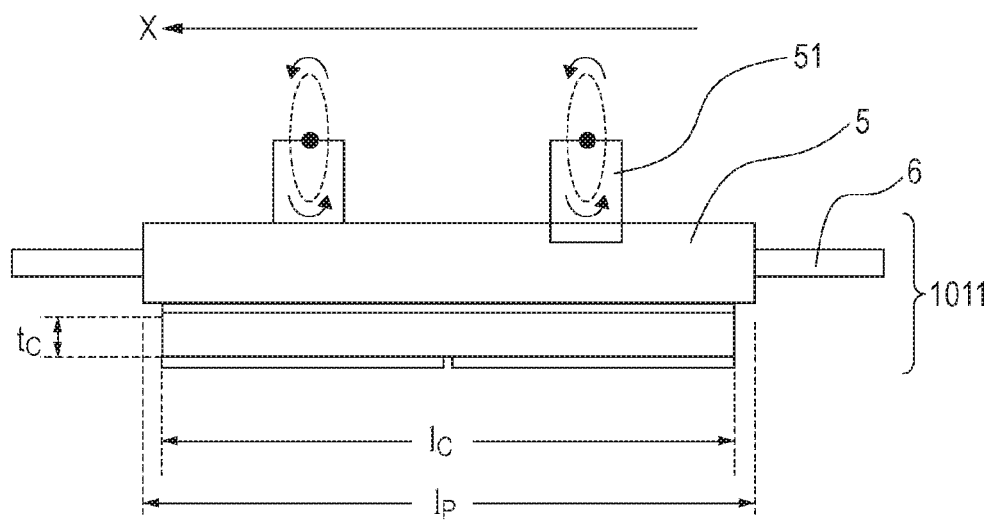

[Fig. 4B]
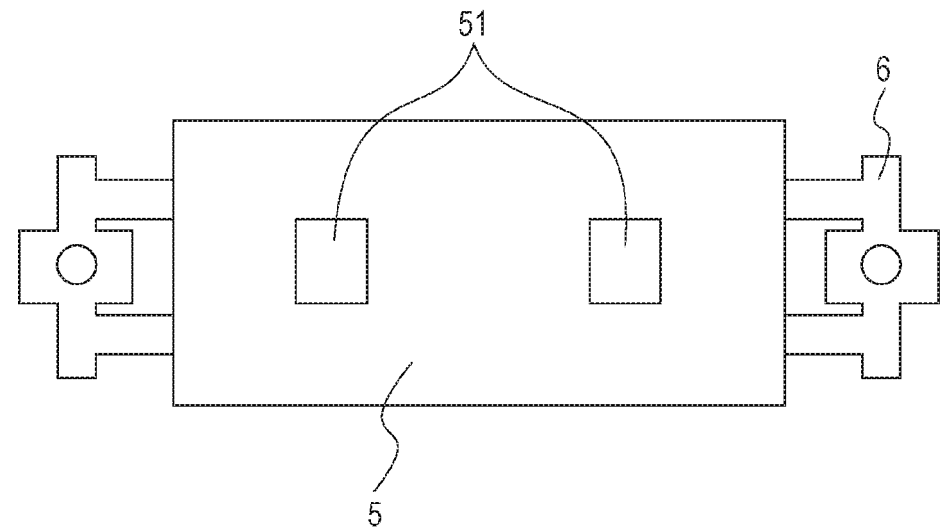
[Fig. 5]
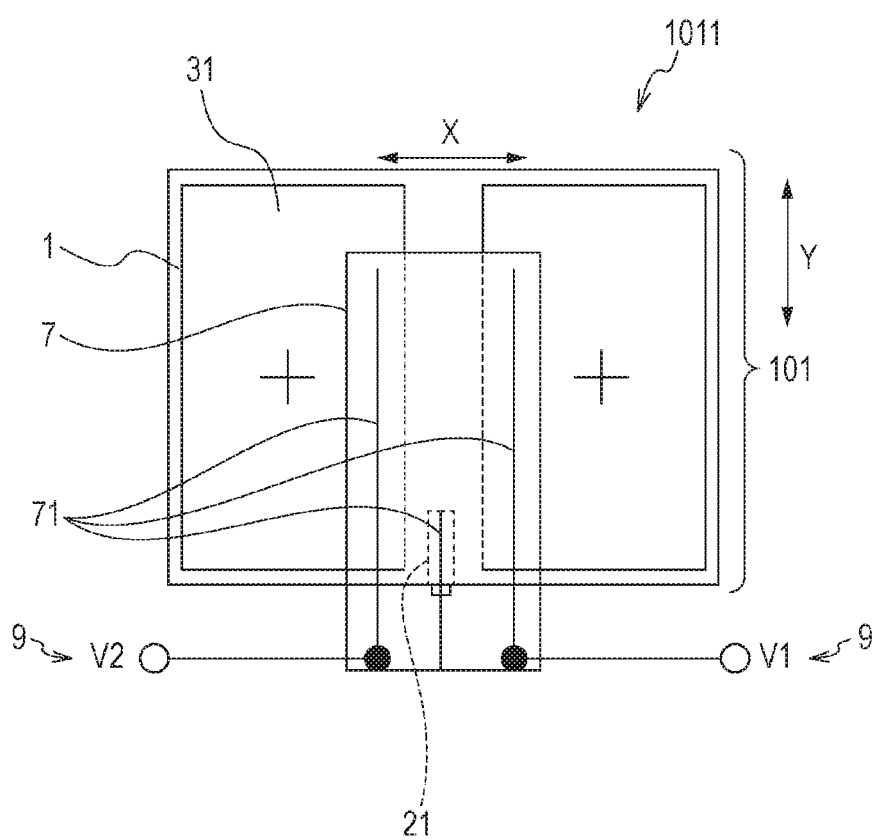

[Fig. 6]
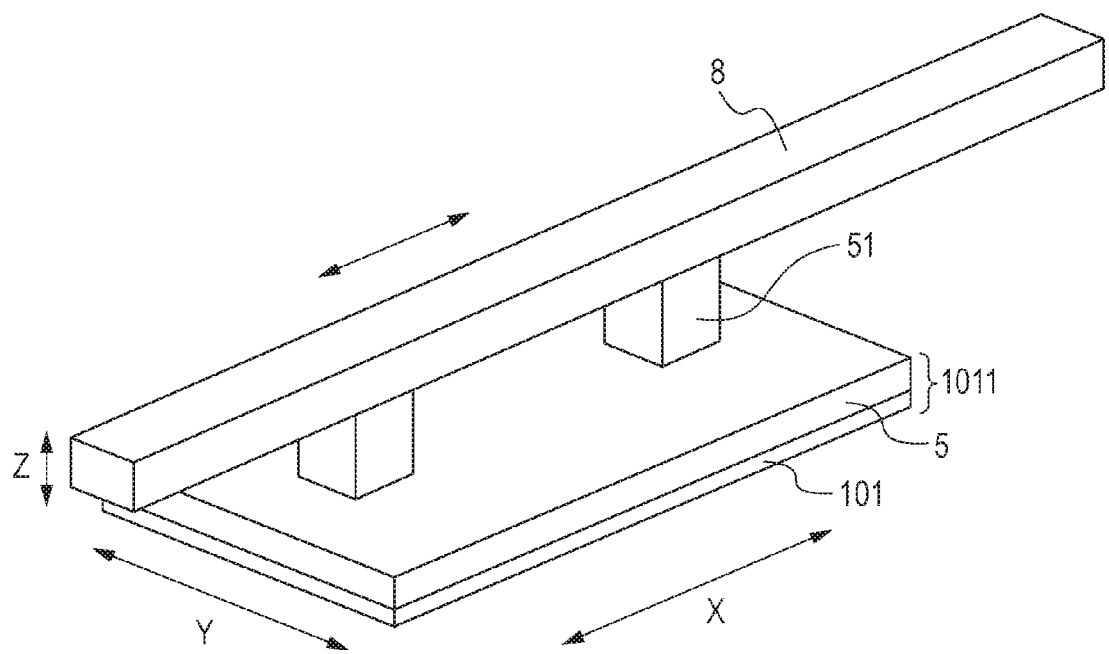

[Fig. 7]
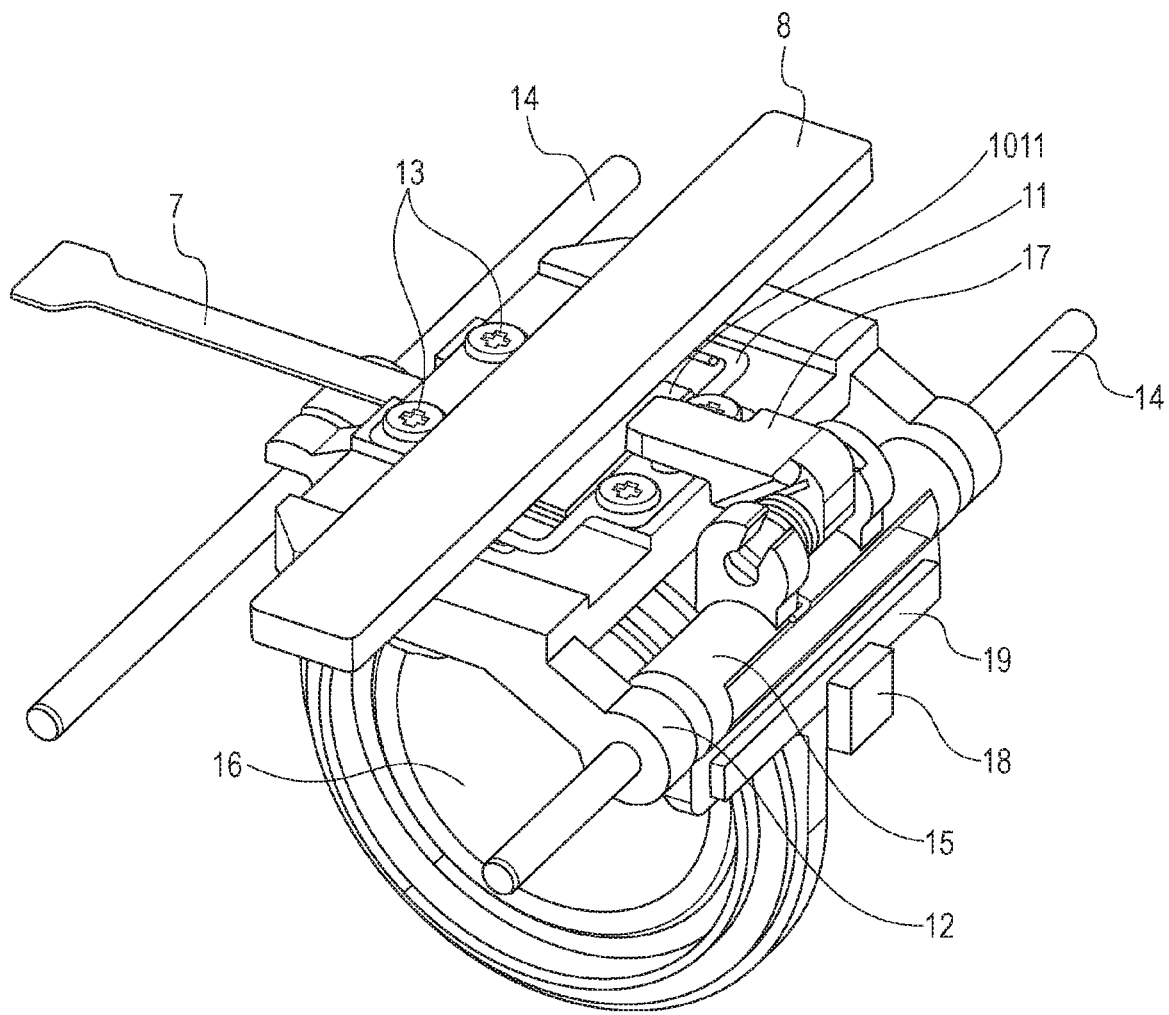

VIBRATOR, VIBRATION WAVE DRIVE DEVICE, VIBRATION WAVE MOTOR, AND ELECTRONICAL DEVICE

CROSS-REFERENCE TO RELATED APPLICATIONS

This application is a National Stage filing of International Application No. PCT/JP2017/045990 filed Dec. 21, 2017, which claims the benefit of Japanese Patent Application No. 2016-254371, filed Dec. 27, 2016, and Japanese Patent Application No. 2017-236227, filed Dec. 8, 2017, the disclosures of each of which are hereby incorporated by reference herein in their entirety.

TECHNICAL FIELD

The present invention relates to a vibrator, and also relates to a vibration wave drive device, a vibration wave motor, and an electronical device each using the vibrator.

BACKGROUND ART

Recently, size reduction and improvements of capabilities of electronical devices have been progressed, and ultrasonic motors have also been demanded to have smaller sizes and to operate at higher speeds with lower power consumptions. PTL 1 discloses an ultrasonic motor that employs a vibrator including a rectangular vibration plate and a piezoelectric element, and that is driven with combination of two vibration modes (i.e., normal vibration and feed vibration).

Piezoelectric ceramics for use in vibrators are generally given by lead zirconate titanate (PZT)-based materials. Those materials contain a large amount of lead at A sites of $ABO_3$-type perovskite metal oxides, and therefore influences upon environments are considered problematic. To cope with that problem, piezoelectric ceramics using perovskite metal oxides not containing lead (or containing lead at the content of less than 1000 ppm) are proposed.

PTL 2 discloses a piezoelectric ceramic in which piezoelectric characteristics are improved by replacing part of A sites of barium titanate with calcium (Ca) and part of B sites with zirconium (Zr).

CITATION LIST

Patent Literature

PTL 1: Japanese Patent Laid-Open No. 2012-231622
PTL 2: Japanese Patent Laid-Open No. 2009-215111

SUMMARY OF INVENTION

However, it has been difficult to directly replace the lead-based piezoelectric ceramic, which is used in the ultrasonic motor disclosed in PTL 1, with non-lead-based piezoelectric ceramic disclosed in PTL 2. In other words, such replacement causes the problem that a motor speed reduces and power consumption during driving (i.e., input power at a constant speed of 0.2 m/s, for example) increases. The reason is presumably as follows. The lead-based piezoelectric ceramic and the non-lead-based piezoelectric ceramic are different in density and Young's modulus from each other. Accordingly, even when a vibrator is satisfactorily driven in the case of using the lead-based piezoelectric ceramic, drive performance of the same vibrator degrades in the case of using the non-lead-based piezoelectric ceramic.

To deal with the above-mentioned problem, the present invention provides a vibrator that has a small size and operates at a high speed with low power consumption even with use of the non-lead-based piezoelectric ceramic. The present invention further provides a vibration wave drive device, a vibration wave motor, and an electronical device each using the vibrator.

To that end, the present invention provides a vibrator including a piezoelectric element including a piezoelectric material and electrodes, and an elastic body, wherein a Pb component contained in the piezoelectric material is less than 1000 ppm, and a resonance frequency $f_A$ in a vibration mode A and a resonance frequency $f_B$ in a vibration mode B satisfy a relation of an absolute value of $(f_B-f_A)>2$ (kHz), the vibration mode A and the vibration mode B generating vibration waves in the elastic body with wave fronts of the vibration waves intersecting each other.

According to the present invention, not only the vibrator using the non-lead-based piezoelectric ceramic, but also a vibration wave drive device, a vibration wave motor, and an optical device, each using the vibrator, can be each driven at a sufficient speed with low power consumption.

Further features of the present invention will become apparent from the following description of exemplary embodiments with reference to the attached drawings.

BRIEF DESCRIPTION OF DRAWINGS

FIG. 1A is a schematic view illustrating an embodiment of a vibrator according to the present invention.
FIG. 1B is a schematic view illustrating the embodiment of the vibrator according to the present invention.
FIG. 2A is a schematic view illustrating one example of two out-of-plane vibration modes in the vibrator according to the present invention.
FIG. 2B is a schematic view illustrating the other example of the two out-of-plane vibration modes in the vibrator according to the present invention.
FIG. 3A is a schematic view referenced to explain an in-plane distribution of a nodal line and a loop line in the vibrator according to the present invention.
FIG. 3B is a schematic view referenced to explain an in-plane distribution of a nodal line and a loop line in the vibrator according to the present invention.
FIG. 3C is a schematic view referenced to explain an in-plane distribution of a nodal line and a loop line in the vibrator according to the present invention.
FIG. 4A is a schematic view illustrating the embodiment of the vibrator according to the present invention.
FIG. 4B is a schematic view illustrating the embodiment of the vibrator according to the present invention.
FIG. 5 is a schematic view illustrating an embodiment of a vibration wave drive device according to the present invention.
FIG. 6 is a schematic view illustrating an embodiment of a vibration wave motor according to the present invention.
FIG. 7 is a schematic view illustrating an embodiment of an optical device that is manufactured using a manufacturing method according to the present invention.

DESCRIPTION OF EMBODIMENTS

Embodiments of a vibrator, a vibration wave drive device, a vibration wave motor, and an electronical device according to the present invention will be described below.

The vibrator according to the present invention includes a piezoelectric element including a piezoelectric material and electrodes, and an elastic body, wherein a Pb component contained in the piezoelectric material is less than 1000 ppm, and a resonance frequency $f_A$ in a vibration mode A and a resonance frequency $f_B$ in a vibration mode B satisfy a relation of an absolute value of $(f_B-f_A)>2$ (kHz), the vibration mode A and the vibration mode B generating vibration waves in the elastic body with wave fronts of the vibration waves intersecting each other.

A vibration wave motor including the vibrator according to the present invention can be driven at a sufficient speed with low power consumption when the above-mentioned condition is satisfied.

Vibrator

The vibrator according to the present invention is a vibrator including a piezoelectric element and an elastic body.

FIGS. 1A and 1B are each a schematic view illustrating an embodiment of the vibrator, denoted by 1011, according to the present invention. FIG. 1A is a schematic view when looking at the vibrator from a lateral direction, and FIG. 1B is a schematic plan view when looking at the vibrator from the side facing the piezoelectric element.

Although the elastic body includes a vibration plate 5 and a support member 6, the support member 6 described later is not illustrated in FIGS. 1A and 1B. The vibration plate 5 is fixedly held on a piezoelectric element 101. Therefore, when the piezoelectric element 101 expands and contracts, the piezoelectric element 101 and the elastic body including the vibration plate 5 are caused to bend as an integral unit, thus generating flexural vibration in an out-of-plane direction (called "out-of-plane vibration" hereinafter).

The wording "fixedly held" implies a state where opposing surfaces of the elastic body and the piezoelectric element 101 are at least partly contacted and fixed to each other, or a state where they are fixed to each other with, for example, an adhesive interposed therebetween. Namely, it implies a state where vibration generated corresponding to expansion and contraction of the piezoelectric element 101 is transmittable to the elastic body. Stated conversely, the wording "state not fixedly held" implies a state where the elastic body including the vibration plate 5 does not substantially move even with expansion and contraction of the piezoelectric element.

Elastic Body

The elastic body is desirably made of a metal for the purpose of developing the flexural vibration together with the piezoelectric element 101, and from the viewpoint of properties and workability of the elastic body itself. Metals usable as the elastic body include, for example, aluminum, brass, stainless steel, and a Fe—Ni (36%) alloy. Among those examples, the stainless steel is desirable from the viewpoint of ensuring adhesion strength in relation to the piezoelectric element 101 with an adhesive (not illustrated) interposed therebetween. Here, the term "stainless steel" implies an alloy containing 50% by mass or more of steel and 10.5% by mass or more of chromium. Among various kinds of stainless steel, martensitic stainless steel is desirable, and SUS420J2 is most desirable. The Young's modulus of the elastic body is not limited to a particular range, but the Young's modulus of the elastic body at a room temperature is desirably in the range of not less than 100 GPa and not more than 230 GPa. If the Young's modulus is less than 100 GPa, there would be a possibility that a driving force generated during driving of the vibrator becomes insufficient. If the Young's modulus of the elastic body is too large, there would be a possibility that a neutral plane of the flexural vibration of the vibrator shifts toward a piezoelectric ceramic 3 from the elastic body side, and that a vibration displacement of the vibrator reduces.

Piezoelectric Element

The piezoelectric element 101 includes the piezoelectric ceramic 3 having a rectangular parallelepiped shape, and electrodes.

Rectangular Parallelepiped Piezoelectric Ceramic

The type of a piezoelectric material used in the invention of this application is not limited to particular one, but it is desirably a ceramic for the reason stated in detail below.

The piezoelectric ceramic 3 has a rectangular parallelepiped shape from the viewpoint of enabling the same to be fabricated with high dimensional accuracy. In general, as the shape is more complex and the symmetry is lower, a more variety of vibration modes appear. This leads to a possibility that undesired vibrations other than desired vibration modes (i.e., a vibration mode A and a vibration mode B described later) are generated, and that displacements of the desired vibration modes are reduced.

The wording "rectangular parallelepiped shape" includes not only an exact rectangular parallelepiped shape, but also a shape obtained by chamfering sides of a rectangular parallelepiped.

Plurality of Electrodes

The piezoelectric element 101 has a plurality of electrodes such that an electric field can be applied to the piezoelectric ceramic 3. The plurality of electrodes are required just to be able to apply an electric field to the piezoelectric ceramic 3, and are given by at least two or more electrodes.

As illustrated in FIG. 1, the electrodes are provided as a first electrode 1 disposed between the piezoelectric ceramic 3 and the vibration plate 5 constituting the elastic body, and a second electrode 2 disposed on one surface of the piezoelectric ceramic 3 on the side opposite to the other surface where the first electrode 1 is disposed, the second electrode 2 being split to two parts.

The electrodes are each formed of a conductive layer having a thickness of about 5 nm to 10 μm. Materials of the electrodes are not limited to particular ones, and materials usually employed in piezoelectric elements can be used. Examples of those materials are metals such as Ti, Pt, Ta, Ir, Sr, In, Sn, Au, Al, Fe, Cr, Ni, Pd, Ag and Cu, and compounds of those metals.

The electrodes may be each made of one among the above-mentioned materials, or formed as laminated layers made of two or more among the above-mentioned materials. The electrodes may be made of different materials.

A method of forming the electrodes is not limited to particular one, and the electrodes may be formed by baking a metal paste, or using another suitable method such as sputtering or a vapor deposition process. The electrodes may be formed into the desired shapes by patterning.

One or more electrodes other than the first electrode 1 and the second electrode 2 may be disposed on the surfaces of the piezoelectric ceramic 3.

Wirings are disposed in association with the electrodes to apply electric fields to corresponding regions of the piezoelectric ceramic, and the wirings are connected to a power supply unit.

Piezoelectric Ceramic

The piezoelectric ceramic 3 is desirably made of one piece of piezoelectric ceramic without including any seams.

The wording "one piece of the piezoelectric ceramic 3" implies a ceramic obtained in the bulk form through firing of raw material powder containing a metal element, and having a substantially uniform composition, the ceramic exhibiting an absolute value of the piezoelectric constant $d_{31}$ of not less than 10 pm/V or the piezoelectric constant $d_{33}$ of not less than 30 pC/N at a room temperature. The piezoelectric constants of the piezoelectric ceramic 3 can be determined in accordance with the Japan Electronics and Information Technology Association standard (JEITA EM-4501) from results of measuring the density, the resonant frequency, and the anti-resonant frequency of the relevant ceramic. Such a method is called the resonance-anti-resonance method hereinafter. The density can be measured by the Archimedes' method, for example. The resonant frequency and the anti-resonant frequency can be measured by employing an impedance analyzer, for example.

The piezoelectric ceramic 3 is a bulk body (sintered body) that is obtained by firing raw material powder, and that has a substantially uniform composition. In the present invention, the piezoelectric ceramic 3 is the so-called non-lead-based ceramic in which the lead content is less than 1000 ppm. More desirably, the piezoelectric ceramic 3 has the Young's modulus of not less than 100 GPa and not more than 145 GPa at the room temperature (e.g., 25° C.) because more superior vibration characteristics are obtained in such a range. The Young's modulus of the piezoelectric ceramic 3 at the room temperature can be calculated by the above-described resonance-anti-resonance method. Most of piezoelectric ceramics having been used so far contain lead zirconate titanate as a main component. It is hence pointed out that, for instance, when piezoelectric elements are discarded and exposed to acid rain or are left to stand in severe environments, lead components in the usual piezoelectric ceramics may dissolve into the soil and may adversely affect the ecological systems. In the case of the lead content being less than 1000 ppm as in the piezoelectric ceramic 3 used in the present invention, however, even if the piezoelectric elements are discarded and exposed to acid rain or are left to stand in severe environments, the influence of the lead component contained in the usual piezoelectric ceramic 3 is held at a negligible level. The content of the lead components can be measured, for example, by an ICP (inductively coupled plasma) atomic emission spectroscopy.

On the other hand, if the Young's modulus of the piezoelectric ceramic 3 at the room temperature is greater than 145 GPa, there would be a possibility that the piezoelectric ceramic 3 is more apt to crack. The reason is that, if the Young's modulus of the piezoelectric ceramic 3 is too large, stress attributable to deformation (distortion) of the piezoelectric ceramic, which is caused with driving of an ultrasonic motor, would be increased.

Generally, when a plate-like member is bent, tensile distortion occurs in a surface on the outermost side, and compressive distortion occurs in a surface on the innermost side. The magnitude of such distortion is maximal at the plate surface, and it gradually reduces toward the inside of the plate in a thickness direction. Near the center of the plate, there is a plane where neither the compressive distortion nor the tensile distortion occurs. Such a plane is called a neutral plane.

If the Young's modulus of the piezoelectric ceramic 3 is too large, the neutral plane of elastic deformation of the vibrator 1011 would shift toward the piezoelectric ceramic 3 from the elastic body side, thereby degrading the efficiency of motor driving and increasing power consumption (i.e., input power at a constant speed of 0.2 m/s, for example).

When the thickness of the piezoelectric ceramic is reduced with intent to shift the neutral plane toward the elastic body side for the purpose of increasing the efficiency of motor driving, the piezoelectric ceramic is more apt to crack because stress caused during deformation increases in proportion to the minus second power of the thickness. Thus, simply thinning the ceramic may lead to a possibility of impeding stable motor driving.

The density of the piezoelectric ceramic 3 is not limited to a particular range. The Young's modulus depends on the density, and it tends to fall within the range of not less than 100 GPa and not more than 145 GPa when the density is not more than $7 \times 10^3$ kg/m$^3$. A more desirable range of the density is not less than $4.0 \times 10^3$ kg/m$^3$ and not more than $7.0 \times 10^3$ kg/m.

Thus, in the desirable piezoelectric ceramic 3, the lead content is less than 1000 ppm, and the Young's modulus at the room temperature is not less than 100 GPa and not more than 145 GPa. An oxide having a perovskite crystal structure (i.e., a perovskite oxide) is more desirable as a substance constituting the piezoelectric ceramic 3.

The "main component" of the piezoelectric ceramic 3 implies a material occupying 51% by weight or more, more desirably 90% by weight or more, and even more desirably 99% by weight or more among materials constituting the piezoelectric ceramic.

In the present invention, the term "perovskite oxide" or "perovskite metal oxide" implies an oxide defined in "Iwanami's Dictionary of Physics and Chemistry 5-th Edition" (published on Feb. 20, 1998 by Iwanami Shoten). More specifically, the term implies an oxide having a perovskite structure that is ideally a cubic structure. In general, an oxide having a perovskite structure is expressed by a chemical formula of $ABO_3$. A molar ratio of an element at a B site to an element at an O site is expressed as being (1 to 3). However, if the oxide has the perovskite structure as a main phase, the relevant oxide can also be called the perovskite oxide even when the ratio between the element amounts slightly deviates from (1 to 3) (e.g., 1.00 to 2.94 through 1.00 to 3.06). Whether the oxide has the perovskite structure can be determined from the result of a structural analysis using X-ray diffraction or electron beam diffraction, for example.

In the perovskite oxide, the elements A and B occupy specific positions of a unit lattice, which are called the A site and the B site, in the form of ions. In a unit lattice of a cubic system, for example, the element A is positioned at an apex of a cubic, and the element B is positioned at a body center of the cubic. The element O occupies, as a negative ion of oxygen, a face center position of the cubic. When the element A, the element B, and the element O slightly shift on a coordinate system from symmetric positions in the unit lattice, the unit lattice of the perovskite structure is distorted, thus providing a tetragonal crystal system, a rhombohedral system, or an orthorhombic crystal system.

Possible combinations of valence numbers of an A site ion and a B site ion are given by $A^+B^{5+}O^{2-}_3$, $A^{2+}B^{4+}O^{2-}_3$, $A^{3+}B^{3+}O^{2-}_3$, and solid solutions resulting from combining two or more among them. The valence number of each ion may be an average valence number of a plurality of ions positioned at the same site.

The vibrator is configured to operate in the above-mentioned vibration mode A in which two nodal lines not intersecting each other are generated in the elastic body and the piezoelectric element, and the above-mentioned vibration mode B in which three nodal lines not intersecting one another are generated in the elastic body and the piezoelectric element, the two nodal lines in the vibration mode A intersecting the three nodal lines in the vibration mode B. Furthermore, the vibrator is constituted such that a resonance frequency $f_A$ in the vibration mode A and a resonance frequency $f_A$ in the vibration mode B satisfy a relation of an absolute value of $(f_B-f_A)>2$ (kHz).

FIGS. 2A and 2B are each a schematic view illustrating one example of two out-of-plane vibration modes in the vibrator according to the present invention. The vibration plate 5 constituting the elastic body includes projections 51. With the elastic body including the projections 51, vibration generated by the vibrator 1011 can be more efficiently transmitted to a moving body held in contact with the projections 51, and hence the moving body can be driven with lower power consumption. As described below, the vibration mode A and the vibration mode B in which wave fronts of vibration waves intersect each other generate in the elastic body. A vibration mode illustrated in FIG. 2A represents one (called the mode A) of the two out-of-plane vibration modes. In the mode A, two nodal lines not intersecting each other generate substantially parallel to a direction of a long side of the vibrator 1011 having the rectangular parallelepiped shape (or a rectangular shape in plan) (i.e., to a direction denoted by an arrow X in relation to the vibration plate 5 constituting the elastic body).

FIGS. 3A and 3B are each a schematic view referenced to explain an in-plane distribution of a nodal line and a loop line in the vibrator according to the present invention. FIG. 3A represents a positional relation among two nodal lines and one loop line when looking at a vibration state from the piezoelectric element side. The nodal line is denoted by a one-dot-chain line, and the loop line is denoted by a dotted line. The two nodal lines in the mode A, illustrated in FIG. 3A, do not intersect each other.

A vibration mode illustrated in FIG. 2B represents the other (called the mode B) of the two out-of-plane vibration modes. In the mode B, three nodal lines not intersecting one another generate substantially parallel to a direction of a short side of the vibrator 1011 having the rectangular parallelepiped shape (or a rectangular shape in plan) (i.e., to a direction denoted by an arrow Y in relation to the vibration plate 5 constituting the elastic body). The resonance frequency, the number of nodal lines, and the positional relation between (among) the nodal lines in each of the mode A and the mode B can be measured, for example, by applying an AC voltage to the vibrator 1011 while the drive frequency is changed. More specifically, they can be determined by measuring an in-plane distribution of displacements in the out-of-plane direction per drive frequency with a laser Doppler vibration meter.

FIG. 3B represents a positional relation among three nodal lines and two loop lines when looking at a vibration state from the piezoelectric element side. The nodal line is denoted by a one-dot-chain line, and the loop line is denoted by a dotted line. Those three nodal lines do not intersect one another.

The resonance frequency $f_A$ in the vibration mode A illustrated in FIG. 2A is measured by assuming, as the nodal line, a place where the displacement (i.e., the displacement in a direction intersecting a plane XY) is substantially zero in the direction of the short side of the vibrator 1011 (i.e., in the Y direction), or a place where positive and negative values of the displacement are reversed from one to the other. Then, the frequency at which the nodal line generates along a direction of a long side of the piezoelectric element 101 (i.e., in the X direction), at which the nodal line generates at two locations (in two lines), and at which the displacement at a middle position (loop line) between the nodal lines at the two locations becomes substantially maximal is determined. The frequency thus determined is the resonance frequency $f_A$ in the vibration mode A. More specifically, the measurement is performed as follows. A frequency band where the nodal line in the mode A generates at two locations (in two lines) is roughly specified by applying voltages in phase (with phase difference of 0°) to the two second electrodes while a frequency of the applied voltages is changed. Thereafter, the resonance frequency $f_A$ is measured by more finely adjusting the frequency of the applied voltages, and by determining the frequency at which the displacement at the middle position (loop line) between the nodal lines at the two locations becomes substantially maximal.

The resonance frequency $f_B$ in the vibration mode B illustrated in FIG. 2B is measured as follows. First, voltages in opposite phases (with phase difference of 180°) are applied to the two second electrodes. While applying the voltages in such a manner, the resonance frequency is measured by recognizing, as the nodal line, a place where the displacement (i.e., the displacement in the direction intersecting the plane XY) is substantially zero in the direction of the long side of the vibrator 1011 (i.e., in the X direction), or a place where positive and negative values of the displacement are reversed from one to the other. Then, the frequency at which the nodal line generates at three locations (in three lines) along the direction of the long side of the piezoelectric element 101 at any places in the direction of the short side thereof, and at which the displacement at a middle position (loop line) between the nodal lines at arbitrary adjacent two among the three locations becomes substantially maximal is determined. The frequency thus determined is the resonance frequency $f_B$ in the vibration mode B.

Here, the two nodal lines in the vibration mode A intersect the three nodal lines in the vibration mode B.

FIG. 3C represents a positional relation among the nodal lines and the loop lines when looking, from the piezoelectric element side, at a state where the mode A and the mode B are superimposed with each other. The nodal line is denoted by a one-dot-chain line, and the loop line is denoted by a dotted line.

Because the two nodal lines in the vibration mode A intersect the three nodal lines in the vibration mode B, the loop line present at the middle between the two nodal lines in the mode A also intersects the three nodal lines in the mode B. Thus, vibration in an elliptic orbit can be generated near each of the intersect points.

In the following, the above point will be described in detail.

The vibration in the elliptic orbit is described in detail below with reference to FIGS. 4A and 4B.

FIG. 4A is an illustration when looking at the vibrator of the present invention from a side laterally facing the long side of the piezoelectric element.

FIG. 4B is an illustration looking the vibrator of FIG. 4A from a side above the projections.

FIG. 4A schematically represents a state where top end portions of the projections 51 are vibrated by successively generating two vibration modes, i.e., the mode A and the mode B. The vibration in the elliptic orbit generates in an X-Z plane near a position where the vibration in the mode A provides the loop and where the vibration in the mode B provides the node. The top end portions (points denoted by ●) of the projections 51, arranged as described above, are also each vibrated in a similar way, thus causing the vibration in the elliptic orbit as denoted by a dotted line in FIG. 4A.

As seen from FIG. 4A, upper and lower portions of the vibration in the elliptic orbit vibrate opposite to each other in the direction of the long side of the vibrator 1011. In the case of the vibration in the elliptic orbit illustrated in FIG. 4A, therefore, when the moving body is to be moved in the +X direction, it is required to make the projections 51 contacted with the moving body during a period in which an upper half of the elliptic motion is under the vibration, and to make the projections 51 not contacted with the moving body or to weaken contact pressure therebetween during a period in which a lower half of the elliptic motion is under the vibration. The contact pressure is determined depending on the displacement in the mode A, which is given by the vibration in the Z direction, and the moving body can be efficiently moved with low power consumption by setting the contact pressure to a proper value. More specifically, the contact pressure is determined by an absolute value of the difference $(f_B-f_A)$ between the resonance frequencies in the two modes. In the case of an absolute value of $(f_B-f_A)$ being smaller than or equal to 2 (kHz), when the moving body is to be moved in the +X direction by generating the vibration in the mode B at frequencies near $f_B$, the vibration in the mode A is also considerably generated at the same time because the value of $f_A$ is close to that of $f_B$. The contact pressure has to be increased in order to suppress the vibration in the mode A. As a result, power efficiency degrades as a whole.

In the case of the absolute value of $(f_B-f_A)>2$ (kHz), the vibrator can be driven with low power consumption (i.e., low input power at a constant speed of 0.2 m/s, for example). The case of $f_B-f_A>2$ (kHz) is more desirable from the viewpoint of easiness in driving control. Generally, in a vibrator, on the higher frequency side of the resonance frequency, dependency of a displacement upon frequency is smaller and the displacement can be more easily controlled with frequency change than on the lower frequency side of the resonance frequency. Therefore, the vibrator 1011 is driven by applying the AC voltages at a frequency higher than the resonance frequencies in the mode A and the mode B, and by performing control to obtain the desired displacement of the vibration through sweep driving of gradually approaching the frequency to the resonance frequency in the mode B. On that occasion, if the resonance frequency in the mode A is present in a frequency range swept in the step of gradually approaching the frequency to the resonance frequency in the mode B, the contact pressure between the projections 51 and the moving body would be too large, and power consumption at the resonance frequency in the mode A would be increased. For that reason, the absolute value of $(f_B-f_A)>2$ (kHz) is desirable.

The case of the absolute value of $(f_B-f_A)$ being greater than or equal to 2.1 (kHz) is even more desirable because the contact pressure in the mode A can be designed to a smaller value and the power consumption can be further reduced.

Shape and Dimensions of Piezoelectric Ceramic

The dimensions of the non-lead-based piezoelectric ceramic 3 are not limited to particular values. However, by designing the piezoelectric ceramic 3 in such dimensions as not extending out from the vibration plate 5 constituting the elastic body, the vibration of the non-lead-based piezoelectric ceramic 3 can be efficiently transmitted to the elastic body, and the vibrator can be driven with lower power consumption. If the piezoelectric ceramic 3 has such dimensions as extending out from the vibration plate 5, an extending-out portion of the piezoelectric ceramic 3 would not contribute to transmitting the vibration to the elastic body. Hence the efficiency deteriorates and the power consumption increases.

When the piezoelectric ceramic 3 is expanded and contracted, the displacement of the vibrator is maximized on condition that a long side $1_c$ of the piezoelectric ceramic occupies the range of 92% to 96% of a long side 1, of the vibration plate 5 constituting the elastic body. If the occupation rate is smaller than 92%, the displacement of the vibrator would be reduced. If the occupation rate is greater than 96%, $\Delta f$ would come closer to 0 and it would be difficult to satisfy the relation of the absolute value of $(f_B-f_A)$ being greater than or equal to 2 (kHz).

The thickness of the piezoelectric ceramic 3 is not limited to a particular value, but the thickness $t_c$ and the long side $1_c$ of the piezoelectric ceramic desirably satisfy a relation of $t_c$ being greater than or equal to 0.250 (mm) and smaller than or equal to $-0.25 \times 1_C + 2.475$ (mm).

When the thickness is greater than 0.250 (mm), the piezoelectric ceramic is less susceptible to cracking during working, and the yield increases. If the thickness is greater than $(-0.25 \times 1_C + 2.475)$, the power consumption (i.e., the input power at the constant speed of 0.2 m/s, for example) of the vibrator would be increased for the reason that the non-lead-based piezoelectric ceramic has greater Young's modulus than the lead-based piezoelectric ceramic, and hence that the neutral plane of the elastic deformation in the vibrator is positioned on the side closer to the piezoelectric ceramic 3.

Composition of Piezoelectric Ceramic

The composition of the piezoelectric ceramic 3 is not limited to particular one insofar as the lead content is less than 1000 ppm (namely, non-lead-based) and the Young's modulus at the room temperature is not less than 100 GPa and not more than 145 GPa. For example, piezoelectric materials of barium titanate series, such as barium titanate, barium calcium titanate, and barium calcium zirconate titanate, may be used. Alternatively, the piezoelectric ceramic 3 may be any of piezoelectric ceramics having compositions of piezoelectric materials of bismuth sodium titanate series, piezoelectric materials of niobate series, such as potassium sodium niobate and sodium barium niobate titanate, piezoelectric materials of bismuth ferrate series, and so on. Moreover, piezoelectric ceramics containing the above-mentioned compositions as main components or in the composite form can be used in the vibrator 1011 according to the present invention.

From the viewpoint of obtaining good vibration characteristics, the piezoelectric ceramic 3 is desirably made of, among the above-mentioned examples, the ceramic that contains, as a main component, an oxide containing Ba, Ca and Ti, and that satisfies a relation of x being greater than or equal to 0.02 and smaller than or equal to 0.30 where x denotes a molar ratio of Ca to the sum of the mol numbers of Ba and Ca. Regarding the content of Zr in the piezoelectric ceramic, y denoting a molar ratio of Zr to the sum of the mol numbers of Ti and Zr satisfies a relation of y being greater than or equal to 0.00 and smaller than or equal to 0.095.

More desirably, a relation of y being greater than or equal to 0.01 and smaller than or equal to 0.095 is to be satisfied from the viewpoint of improving the vibration characteristics.

Above all, the piezoelectric ceramic 3 desirably contains, as a main component, a perovskite metal oxide expressed by the following general formula (1)

$$(Ba_{1-x}Ca_x)_\alpha(Ti_{1-y}Zr_y)O_3 \quad (1)$$

where α is greater than or equal to 0.986 and smaller than or equal to 1.100.

x is greater than or equal to 0.02 and smaller than or equal to 0.30, and y is greater than or equal to 0.00 and smaller than or equal to 0.095, and the content of metal components contained in the piezoelectric ceramic other than the main component is not more than 1 weight part in terms of metal with respect to 100 weight parts of the metal oxide.

In particular, desirably, the metal oxide contains Mn, and the content of Mn is not less than 0.02 weight part and not more than 0.40 weight part in terms of metal with respect to 100 weight parts of the metal oxide.

The metal oxide expressed by the general formula (1) implies that metal elements positioned at the A sites are Ba and Ca, and that metal elements positioned at the B sites are Ti and Zr. However, parts of Ba and Ca may be positioned at the B sites. Similarly, parts of Ti and Zr may be positioned at the A sites.

In the general formula (1), a molar ratio of the elements at the B sites to the element O is (1 to 3). Even with the molar ratio slightly deviating from the above value, however, the case where the metal oxide has the perovskite structure as a main phase falls within the scope of the present invention.

Whether the metal oxide has the perovskite structure can be determined from the result of a structural analysis using X-ray diffraction or electron beam diffraction, for example.

The Young's modulus of the piezoelectric ceramic 3 containing, as the main component, the perovskite metal oxide expressed by the general formula (1) at the room temperature (e.g., 25° C.) is substantially in the range of 100 GPa to 145 GPa.

In the general formula (1), x denoting the molar ratio of Ca at the A site is in the range of being greater than or equal to 0.02 and smaller than or equal to 0.30. When part of Ba in perovskite barium titanate is replaced with Ca within the specified range, the phase transition temperature between the orthorhombic crystal and the tetragonal crystal is shifted toward the lower temperature side, whereby stable piezoelectric vibration can be obtained in a drive temperature range of the vibration wave motor and the vibrator 1011. However, if x is greater than 0.30, there would be a possibility that the piezoelectric constant of the piezoelectric ceramic is not sufficiently large, and that a rotational speed of the vibration wave motor becomes insufficient. On the other hand, if x is smaller than 0.02, there would be a possibility that a dielectric loss (tan δ) increases. An increase of the dielectric loss may lead to a possibility of increasing heat that is generated when the voltages are applied to the piezoelectric element 101 to drive the motor, reducing the efficiency in driving of the motor, and increasing the consumed output power.

In the general formula (1), y denoting the molar ratio of Zr at the B site is in the range of being greater than or equal to 0.00 and smaller than or equal to 0.095. If y is greater than 0.095, there would be a possibility that the depolarization temperature ($T_d$), i.e., the ceiling temperature of piezoelectricity, lowers to below 80° C., and that the piezoelectric characteristics of the piezoelectric ceramic disappear at high temperatures.

In this Description, the term "depolarization temperature ($T_d$)" is defined as follows. In a process of raising temperature from the room temperature to a certain temperature $T_d$ (° C.) after the lapse of a sufficient time from polarization treatment, and then lowering temperature down to the room temperature again, the temperature at which the piezoelectric constant is reduced from the piezoelectric constant before raising temperature is the depolarization temperature. In this Description, the temperature at which the piezoelectric constant becomes less than 90% of that before raising temperature is called the depolarization temperature $T_d$.

In the general formula (1), α denoting the ratio of the mol amount of Ba and Ca at the A sites to the mol amount of Ti and Zr at the B sites is desirably in the range of being greater than or equal to 0.986 and smaller than or equal to 1.100. If α is smaller than 0.986, crystal grains constituting the piezoelectric ceramic would be more susceptible to abnormal grain growth, and mechanical strength of the piezoelectric ceramic would be reduced. On the other hand, if a is greater than 1.100, a temperature necessary to develop grain growth of the piezoelectric ceramic would be so high that the piezoelectric ceramic cannot be sintered using an ordinary furnace. Here, the wording "cannot be sintered" implies a state where the density does not take a sufficient value, or a state where many pores or defects are present inside the piezoelectric ceramic.

A method of measuring the composition of the piezoelectric ceramic 3 is not limited to particular one. Examples of the measuring method include an X-ray fluorescence analysis, an ICP atomic emission spectroscopy, and an atomic absorption analysis. A weight ratio and a composition ratio of individual elements contained in the piezoelectric ceramic 3 can be measured with any of those measuring methods.

Desirably, the piezoelectric ceramic 3 contains, as a main component, the perovskite metal oxide expressed by the general formula (1), the metal oxide containing Mn, and the content of Mn is not less than 0.02 weight part and not more than 0.40 weight part in terms of metal with respect to 100 weight parts of the metal oxide.

The piezoelectric ceramic containing Mn in the above-mentioned range is improved in insulating properties and the mechanical quality coefficient $Q_m$. Here, the term "mechanical quality coefficient $Q_m$" implies a coefficient representing an elastic loss that is caused by vibration in the case of evaluating a piezoelectric element as a vibrator. The magnitude of the mechanical quality coefficient is observed as sharpness of a resonance curve in the result of impedance measurement. In other words, the mechanical quality coefficient $Q_m$ is a constant representing sharpness of the resonance of the piezoelectric element. When the mechanical quality coefficient $Q_m$ is large, a distortion amount of the piezoelectric element near the resonance frequency is increased, and the piezoelectric element can be vibrated effectively. Although PTL 2 includes no suggestions regarding the mechanical quality coefficient $Q_m$, it is deemed that a $Q_m$ value is relatively small and the distortion amount near the resonance frequency is also relatively small in the piezoelectric ceramic disclosed in PTL 2 because it does not contain Mn.

The improvement of the insulation properties and the mechanical quality coefficient is presumably attributable to the fact that an internal electric field is generated with defective dipoles introduced by Mn having a valence different from those of Ti and Zr. With the presence of the internal electric field, reliability of the piezoelectric element 101 can be ensured when the piezoelectric element 101 is driven with application of the voltages.

The content of Mn is calculated as follows. First, the contents of individual metals, i.e., Ba, Ca, Ti, Zr and Mn, are measured from the piezoelectric ceramic 3 by the X-ray fluorescence (XRF) analysis, the ICP atomic emission spectroscopy, or the atomic absorption analysis, for example. Then, weights of the elements constituting the metal oxide expressed by the general formula (1) are converted in terms of oxide, and a ratio of Mn weight to total weight of those elements after the conversion, the total weight being assumed to be 100, is calculated as the content of Mn.

If the content of Mn is less than 0.02 weight part, there would be a possibility that the effect of polarization treatment required for driving of the piezoelectric element 101 becomes insufficient. On the other hand, if the content of Mn is greater than 0.40 weight part, there would be a possibility that the piezoelectric characteristics become insufficient, or that crystals of hexagonal structure, not contributing to the piezoelectric characteristics, are developed.

Mn is not limited to metal Mn, and is just required to be contained, as a Mn component, in a piezoelectric material regardless of the form of contained Mn. For instance, Mn may be dissolved in a solid state at the B site, or may be contained at the grain boundary. The piezoelectric ceramic 3 may contain the Mn component in the form of not only metal, but also ion, oxide, metal salt, complex, etc. The desirable form of contained Mn is solid solution to the B site from the viewpoint of the insulation properties and easiness in sintering. In the case of the solid solution to the B site, assuming that the ratio of the mol amount of Ba and Ca at the A sites to the mol amount of Ti, Zr and Mn at the B sites is denoted by A2/B2, a desirable range of A2/B2 is greater than or equal to 0.993 and smaller than or equal to 0.998.

The piezoelectric ceramic 3 may contain 0.042 weight part or more and 0.850 weight part or less of Bi in terms of metal with respect to 100 weight parts of the metal oxide expressed by the general formula (1). The content of Bi with respect to the metal oxide can be measured by an ICP atomic emission spectroscopy, for example. Bi may be present at the grain boundary of a piezoelectric material in the ceramic form, or may be dissolved in a solid state in the perovskite structure of $(Ba, Ca)(Ti, Zr)O_3$. When Bi is present at the grain boundary, friction between grains reduces and the mechanical quality coefficient increases. On the other hand, when Bi is taken into a solid solution forming the perovskite structure, the phase transition temperature lowers and dependency of the piezoelectric constant upon temperature reduces, whereby the mechanical quality coefficient is further improved. When a position of Bi taken into the solid solution is the A site, this is desirable because charge balance with respect to Mn is improved.

The piezoelectric ceramic 3 may contain components (called "accessory components" hereinafter) other than the elements included in the general formula (1), Mn and Bi insofar as not changing the characteristics. A total amount of the accessory components is desirably less than 1.2 weight parts with respect to 100 weight parts of the metal oxide expressed by the general formula (1). If the accessory components exceed 1.2 weight parts, there would be a possibility that the piezoelectric characteristics and the insulation characteristics of the piezoelectric ceramic 3 degrade. Furthermore, the content of metal elements among the accessory components other than Ba, Ca, Ti, Zr and Mn is desirably not more than 1.0 weight part in terms of oxide or not more than 0.9 weight part in terms of metal with respect to 300 weight parts of the piezoelectric ceramic. In the present invention, the wording "metal elements" includes metalloid elements, e.g., Si, Ge and Sb, as well. If the content of the metal elements other than Ba, Ca, Ti, Zr and Mn exceeds 1.0 weight part in terms of oxide or 0.9 weight part in terms of metal with respect to 300 weight parts of the piezoelectric ceramic, there would be a possibility that the piezoelectric characteristics and the insulation characteristics of the piezoelectric ceramic 3 degrade considerably.

A total amount of Li, Na, Mg and Al elements among the accessory components is desirably not more than 0.5 weight part in terms of metal with respect to 300 weight parts of the piezoelectric ceramic. If the total amount of the Li, Na, Mg and Al elements exceeds 0.5 weight part in terms of metal with respect to 300 weight parts of the piezoelectric ceramic, there would be a possibility that sintering is insufficient. A total amount of Y and V elements among the accessory components is desirably not more than 0.2 weight part in terms of metal with respect to 300 weight parts of the piezoelectric ceramic. If the total amount of the Y and V elements exceeds 0.2 weight part in terms of metal with respect to 300 weight parts of the piezoelectric ceramic, there would be a possibility that the polarization treatment is difficult to carry out.

Examples of the accessory components are sintering aids such as Si, Cu and B. The piezoelectric material used in the present invention may contain Sr and Mg in such an amount as usually contained, as unavoidable components, in commercially available materials for Ba and Ca. Similarly, the piezoelectric ceramic 3 in the present invention may contain Nb in such an amount as usually contained, as an unavoidable component, in commercially available materials for Ti, and may contain Hf in such an amount as usually contained, as an unavoidable component, in commercially available materials for Zr.

A method of measuring the weight parts of the accessory components is not limited to particular one. Examples of the measuring method include the X-ray fluorescence (XRF) analysis, the ICP atomic emission spectroscopy, and the atomic absorption analysis.

Support Member of Elastic Body

The elastic body in the vibrator according to the present invention includes the vibration plate 5 and the support member 6. More desirably, the vibration plate 5 and the support member 6 are formed integrally with each other. FIG. 4B is a schematic view illustrating the embodiment of the vibrator according to the present invention. In the illustrated embodiment, the support member 6 made of the same material as that of the vibration plate 5 is disposed outside the surface of the vibration plate 5 and is connected to the vibration plate 5. With such a configuration, the vibrator can be easily mounted to a piezoelectric device, such as a vibration motor described later, without impeding the vibration generated from the vibrator. By forming holes in the support member 6 as illustrated in FIG. 4B and fitting fixing member into the holes, the structure of the piezoelectric device can be designed with versatility. The shape of the support member 6 is not limited to particular one, but the support member 6 is desirably smaller than the elastic body. Moreover, it is desirable that at least part of the support member 6 is thinner than the vibration plate 5 or has a narrower shape than the vibration plate 5 with intent not to attenuate the vibration of the vibrator as far as possible in a state of supporting the vibration plate 5 by the support member 6.

Vibration Wave Drive Device

The vibration wave drive device according to the present invention is featured in including the above-described vibrator and a power supply member 7 that supplies power to the vibrator.

FIG. 5 is a schematic view illustrating an embodiment of a vibration wave drive device according to the present invention. As illustrated in FIG. 5, voltage applying devices 9 apply voltages to the vibrator 1011 through the power supply member 7 and electric wirings 71 included in the power supply member 7. An AC voltage (V1) is applied to one of two drive phase electrodes 31 of the piezoelectric element 101, the one being positioned on the right side, and an AC voltage (V2) is applied to the other drive phase electrode 31 positioned on the left side. When V1 and V2 are applied at a frequency near the resonance frequency in the mode A in the same phase, the piezoelectric element 101 (corresponding to the drive phase electrodes 31) is expanded and contracted in the entirety. As a result, the vibration in the mode A generates in the vibrator 1011. When V1 and V2 are applied at a frequency near the resonance frequency in the mode B in phases shifted through 180°, the piezoelectric element 101 corresponding to the drive phase electrode 31 on the right side is contracted, and the piezoelectric element 101 corresponding to the drive phase electrode 31 on the left side is expanded. Alternatively, the piezoelectric element 101 corresponding to the drive phase electrode 31 on the left side is contracted, and the piezoelectric element 101 corresponding to the drive phase electrode 31 on the right side is expanded. As a result, the vibration in the mode B generates in the vibrator 1011. By generating the two modes independently of each other in such a manner, the vibration displacement is increased, and the resonance frequency can be easily determined when the resonance frequency is measured with the laser Doppler vibration meter as described above. The vibration displacement is extremely reduced when a later-described moving body is brought into contact with the vibrator. In the case of measuring the resonance frequency, therefore, the resonance frequency is desirably measured in a state where the moving body is not brought into contact with the vibrator. However, when the moving body is not brought into contact with the vibrator, there would be a possibility that the vibration displacement is increased excessively, and that the piezoelectric ceramic 3 is damaged. Accordingly, the amplitudes of V1 and V2 are desirably held as small as possible. An allowable level is such that an electric field of 1 to 20 V/mm at maximum is applied to the piezoelectric ceramic 3.

Furthermore, the amplitudes of V1 and V2 are desirably set to have the same absolute value. Such setting is effective in increasing the vibration displacement when the individual modes are actively generated.

A phase difference θ between V1 and V2 will be described below.

When the phase difference θ is set to a value between 0° and 180° (i.e., 0°<θ<180°), vectors of (V1+V2) and (V1−V2) are orthogonal to each other. This represents that the vibrations in the mode A and the mode B are generated, and that the phase difference between both the vibrations is shifted through 90°. As a result, in the vibration in the elliptic orbit illustrated in FIG. 4A, the displacement in the Z direction is maximized when the speed of the projection 51 in the X direction is maximal. Accordingly, by driving the vibrator in a state of contacting the moving body, the moving body can be moved.

Thus, by setting the amplitudes of the voltage of V1 and V2 to be the same and the phase difference θ between V1 and V2 to a value other than 0° and 180°, the mode A and the mode B can be generated, and the phase difference between both the vibrations is always held at 90° or −90°. Therefore, the displacement in the Z direction is maximized when the speed of the projection 51 in the X direction is maximal. Hence the moving body can be moved efficiently.

The displacements in the mode A and the mode B can be changed by changing the phase difference θ between V1 and V2. However, when the displacement in the mode A increases, the displacement in the mode B decreases. Conversely, when the displacement in the mode A decreases, the displacement in the mode B increases. The contact pressure between the projection 51 and the moving body can be changed depending on the phase difference θ as well, but the displacement in the mode B is also changed at the same time. Thus, the contact pressure cannot be adjusted in a similar manner to that in controlling the absolute value of $(f_B - f_A)$.

Vibration Wave Motor

A vibration wave motor according to the present invention is featured in including the vibration wave drive device, and the moving body held in contact with the elastic body. With such a configuration, the vibration wave motor capable of accurately moving the moving body can be provided. FIG. 6 is a schematic view illustrating an embodiment of the vibration wave motor according to the present invention. As illustrated in FIG. 6, the moving body (slider) 8 is disposed on the elastic body with the projections 51 interposed therebetween. The two projections 51 are desirably arranged to be symmetric with respect to the XZ plane or the YZ plane passing the center of the elastic body. This is because reaction forces received by the vibrator 1011 at the projections 51 from the moving body (slider) 8 are avoided from being biased. Here, the top ends of the projections 51 are desirably held in a pressure contact state pressed by the moving body (slider) 8. Under the pressure contact state, the moving body (slider) 8 can be moved in directions denoted by arrows with elliptic motions of the projections 51. While the above description is made in connection with the case where the vibration wave drive device is kept fixed and the moving body is moved, the configuration may be modified such that the moving body is kept fixed and the vibration wave drive device is moved.

Optical Device

An optical device according to the present invention is featured in including the above-described vibration wave motor, and an optical member disposed to be movable by the vibration wave motor. The optical member and the moving body are dynamically connected to each other. In the present invention, the wording "dynamically connected" implies a state where two members are directly contacted with each other or contacted with a third member interposed therebetween such that force generated with coordinate variation, volume change, or shape change of one member is transmitted to the other member. By dynamically connecting the vibration wave motor to the moving body and further to the optical member, the optical member can be moved accurately.

FIG. 7 is a schematic view illustrating an embodiment of the optical device (focus lens unit in a lens barrel device) according to the present invention. In FIG. 7, the moving body (slider) 8 is held in pressure contact with the vibrator 1011. The power supply member 7 is disposed on the same side as a surface of the vibrator 1011, the surface including the second electrode of the piezoelectric element. When the desired voltages are applied to the vibrator 1011 from the voltage applying devices (not illustrated in FIG. 7) through the power supply member 7, the projections (not illustrated in FIG. 7) of the elastic body cause elliptic motions.

A holding member 11 is fixed to the vibrator 1011 by welding, for example, such that undesired vibrations are not generated. A moving case 12 is fixed to the holding member 11 by screws 13 to be integrated with the vibrator 1011. The vibration wave motor (ultrasonic motor) is formed by the above-mentioned members. Two guide members 14 are mounted to the moving case 12 such that the vibration wave motor can be linearly moved in opposite directions (forward direction and backward direction) over the guide members 14.

A lens 16 (optical member) serving as a focus lens of the lens barrel device will be described below. The lens 16 is fixed to a lens holding member 15, and it has an optical axis (not illustrated) parallel to a moving direction of the vibration wave motor. The lens holding member 15 is linearly moved over the two guide members 14 (described below), as with the vibration motor, for focus alignment (focusing operation). The two guide members 14 are fitted to both the moving case 12 and the lens holding member 15 so as to allow linear motions of the moving case 12 and the lens holding member 15. With such a configuration, the moving case 12 and the lens holding member 15 can be moved linearly over the guide members 14.

A coupling member 17 serves as a member for transmitting driving force generated by the vibration wave motor to the lens holding member 15, and it is fitted and mounted to the lens holding member 15. With such a configuration, the lens holding member 15 can be smoothly moved together with the moving case 12 in the opposite directions along the two guide members 14.

A sensor 18 reads position information of a scale 19 bonded to a lateral surface of the lens holding member 15, thereby detecting a position of the lens holding member 15 on the guide members 14.

Thus, the focus lens unit in the lens barrel drive is constituted by assembling the individual members as described above.

While the above description is made in connection with the lens barrel device for a single-lens reflex camera as an example of the optical device, the present invention can be applied to a variety of optical devices equipped with vibration wave motors, including various types of cameras such as a compact camera in which a lens and a camera body are integrated with each other, and an electronic still camera.

Method of Manufacturing Elastic Body

A method of manufacturing the elastic body is not limited to particular one. After preparing a rectangular plate for the elastic body (made of, e.g., SUS420J2), the plate may be worked into the desired shape by grinding, polishing, and/or laser processing.

The elastic body including the projections can be formed by press working, for example, or fabricated by forming the projections separately from the elastic body, and then fixing the projections to the elastic body. From the viewpoint of easiness in the press working, the thickness of the elastic body is desirably in the range of not less than 0.1 mm and not more than 5 mm. The projections desirably have the height of about 0.1 mm to 4 mm, and occupy an area of 1 $mm^2$ to 25 $mm^2$ on the elastic body. The shape of the projections may be rectangular parallelepiped, circular columnar, or semispherical.

Lengths of the elastic body in a long-side direction and a short-side direction are each desirably not more than 20 mm from the viewpoint of size reduction, and not less than 2 mm from the viewpoint of easiness in working.

A contact portion being superior in friction coefficient and wear resistance may be disposed at the top end of each of the projections. When the projections are formed integrally with the elastic body, the man-hour required for assembling the elastic body can be reduced in comparison with the case of forming the projections and the elastic body separately. Furthermore, since it is no longer required to perform positioning between the projections and the elastic body, variations among the fabricated parts can be suppressed.

Method of Manufacturing Piezoelectric Element and Vibrator

A method of manufacturing the vibrator according to the present invention is not limited to particular one. A typical manufacturing method is described below. The piezoelectric element used in the vibrator is obtained by forming a plurality of electrodes on a piece of piezoelectric ceramic having a rectangular parallelepiped shape. The piece of piezoelectric ceramic having the rectangular parallelepiped shape can be obtained, for example, by firing raw material powder containing the desired metal elements, and by working a sintered body of the raw material powder into the desired shape. The plurality of electrodes can be formed, for example, by sputtering, or by coating a metal paste and drying or baking the coated metal paste. A silver paste is desirably used from the viewpoint of ensuring a low cost and providing sufficient conductivity.

Polarization treatment needs to be performed in order to develop piezoelectricity in the piezoelectric element. The polarization treatment may be performed before or after a later-described step of fixing the piezoelectric element to the elastic body. However, when the polarization treatment is performed before the fixing step, subsequent steps need to be performed below the Curie temperature of the relevant piezoelectric ceramic. The reason resides in avoiding depolarization of the piezoelectric ceramic and preventing disappearance of the piezoelectricity.

Then, the piezoelectric element is fixed to the elastic body. In a fixing step, for example, an elastic resin precursor having fluidity is coated over a bonding surface of the piezoelectric element or the vibrator. Here, the term "fluidity" implies properties continuously flowing and moving without standing still. The term "elastic resin precursor" implies elastic resin before being cured, namely an adhesive in a liquid state. The adhesive may be of the so-called one-component type or two-component type. A surface over which the elastic resin precursor is coated may be any of the bonding surface of the piezoelectric element or the bonding surface of the vibrator.

Then, the elastic resin precursor is cured. In a curing step, the piezoelectric element and the elastic body are brought into pressure contact with the coated surface interposed therebetween. In a pressure contact state, the applied pressure needs to be not lower than such a level as keeping the piezoelectric ceramic immovable relative to the elastic body, and not higher than such a level as avoiding cracking of the piezoelectric ceramic. When the elastic resin precursor is a thermosetting adhesive, a curing time can be shortened by heating the vibrator under the pressure contact state. In a heating step, a heating temperature needs to be determined in consideration of the Curie temperature of the piezoelectric ceramic as described above.

In addition, the power supply member may be provided in association with the electrodes as required. With the provision of the power supply member, the voltage applying devices (e.g., power supplies) and the vibrator can be electrically conducted to each other.

Method of Manufacturing Vibration Wave Drive Device

A method of manufacturing the vibration wave drive device according to the present invention is not limited to particular one. As illustrated in FIG. 6, by way of example, the moving body (slider) 8 is disposed on the elastic body with the two projections 51 positioned therebetween. The two projections 51 are desirably arranged to be symmetric with respect to the XZ plane or the YZ plane passing the center of the elastic body. This is because reaction forces received by the vibrator 1011 at the projections 51 from the moving body (slider) 8 are avoided from being biased. Here, the top ends of the projections 51 are desirably held in a pressure contact state pressed by the moving body (slider) 8. Under the pressure contact state, the moving body (slider) 8 can be moved in directions denoted by arrows with the vibrations of the projections 51 in the elliptic orbits.

EXAMPLES

The vibration wave drive device, the vibration wave motor, and the optical device according to the present invention will be described below with reference to EXAMPLES, but the present invention is not restricted by the following EXAMPLES.

Example 1

First, a piezoelectric ceramic was obtained by firing metal oxide powder. As a result of measuring a composition of the piezoelectric ceramic by an X-ray fluorescence (XRF) analysis, the piezoelectric ceramic contained 0.16 weight part of Mn in terms of metal and 0.28 weight part of Bi in terms of metal with respect to 100 weight parts of $(Ba_{0.86}Ca_{0.14})_{0.989}(Ti_{0.93}Zr_{0.07})O_3$. The content of lead was less than 200 ppm. As a result of analyzing a crystal structure of the piezoelectric ceramic by an X-ray diffraction (XRD) measurement, it was proved that the piezoelectric ceramic had the perovskite structure. Thus, the piezoelectric ceramic contained a non-lead-based perovskite metal oxide. As a result of measuring a density of the piezoelectric ceramic by the Archimedes' method, the density was $5.7 \times 10^3$ kg/m$^3$.

Then, the piezoelectric ceramic was worked into dimensions of $10 \times 2.5 \times 0.5$ mm$^3$ to measure various parameters of the piezoelectric ceramic. A test piece of piezoelectric element was fabricated by coating, as electrodes, silver pastes over two surfaces ($10 \times 2.5$ mm$^2$) of the piezoelectric ceramic with screen printing. The silver pastes were baked by holding the test piece at 800° C. for 10 minutes. Then, the fabricated test piece of piezoelectric element was subjected to polarization treatment on conditions of temperature of 100° C., electric field of 1 kV/mm, and time of 30 minutes. As a result of evaluating the test piece of piezoelectric element at the room temperature (25° C.) by the resonance-anti-resonance method, the Young's modulus Yp was 125 GPa, and the piezoelectric constant $d_{31}$ was −90 pm/V.

After grinding and polishing the piezoelectric ceramic into a thickness of 0.30 mm, the piezoelectric ceramic was cut into a size of $8.3 \times 5.7$ mm$^2$, and one piece of the piezoelectric ceramic having a rectangular parallelepiped shape was obtained. Drive phase electrodes and ground electrodes were formed on opposite surfaces of the one piece of piezoelectric ceramic with screen printing using silver pastes. A coupling electrode was formed on a lateral surface of the piezoelectric ceramic to establish electrical conduction between the ground electrodes formed on the opposite surfaces of the piezoelectric ceramic, whereby the piezoelectric element was obtained. A silver paste was used to form the coupling electrode. The silver paste was baked by holding the piezoelectric element at 800° C. for 10 minutes. An elastic body was then fixed to the piezoelectric element with an adhesive interposed therebetween.

The elastic body was made of magnetic stainless steel SUS420J2 in conformity with the JIS standard, the steel having dimensions of $9.0 \times 5.8 \times 0.3$ mm$^3$. SUS420J2 is martensitic stainless steel with a composition containing 70% by mass or more of steel and 12 to 14% by mass of chromium, and with the Young's modulus Ys of 204 GPa. A support member such as illustrated in FIGS. 4A and 4B was disposed outside the surface of the elastic body, and s projection such as illustrated in FIGS. 4A, 4B and 6 was provided within the surface of the elastic body. In this EXAMPLE, the projection had a rectangular parallelepiped shape of $3 \times 3$ mm$^2$ with a height of 1 mm, and was formed by press working. Although FIGS. 4A, 4B and 6 illustrate the projection having an ideal rectangular parallelepiped shape, corners of the projection were in fact slightly rounded due to limitations in the working. The projection was provided at two positions located in a central region of the elastic body in a short-side direction thereof and spaced through 1.7 mm from both ends of the elastic body in a long-side direction thereof.

The adhesive was given as an epoxy-based liquid adhesive (having the glass transition temperature of 120° C.), and was coated in a sufficient amount over a bonding surface of the elastic body by employing a dispenser. The elastic body was brought into pressure contact with one surface of the piezoelectric element on the side opposite to the other surface on which the drive phase electrodes were formed. The adhesive was then cured by placing both the elastic body and the piezoelectric element in the pressure contact state into a furnace, and by holding them at 130° for 60 minutes.

Then, as illustrated in FIG. 5, the power supply member was bonded, by thermal pressure bonding, to the drive phase electrodes and the ground electrodes on the surface of the piezoelectric element to which the elastic body is not fixed. More specifically, the power supply member in the form of a flexible cable was connected to the piezoelectric element by employing an anisotropic conductive film (ACF). Conditions for the thermal pressure bonding were set to time of 10 sec and pressure of 2 Mpa.

Then, the polarization treatment was performed on the piezoelectric ceramic at 100° C. More specifically, contact pins for the polarization treatment were brought into contact with the two drive phase electrodes of the piezoelectric element, and DC voltages were applied to the drive phase electrodes with the elastic body connected to the ground. At that time, the DC voltages were applied to the piezoelectric ceramic for 30 minutes on condition that the strength of an electric field was 1.0 kV/mm.

A vibrator E according to the present invention was obtained through the above-described steps.

Subsequently, a vibration wave drive device A such as illustrated in FIG. 5 was fabricated by connecting the voltage applying devices to the vibrator E through the power supply member.

The AC voltages V1 and V2 (each having the amplitude of 10 Vpp) were applied to the vibration wave drive device A through the drive phase electrodes. In that state, while changing frequency from 150 kHz to 1 kHz, an in-plane distribution of displacements of the vibrator in the out-of-plane direction was measured at each frequency with the laser Doppler vibration meter.

First, when the phase difference between V1 and V2 was set to 0°, the vibration mode A with two nodal lines not intersecting each other was generated in the vibrator E, and the displacement at a position of the middle (corresponding to a loop line) between the two nodal lines was maximized at 87.80 kHz. As a result, it was found that the resonance frequency $f_A$ in the vibration mode A of the vibrator E was 87.80 kHz.

Next, when the phase difference between V1 and V2 was set to 180°, the vibration mode B with three nodal lines not intersecting one another was generated, and the displacement at a position of the middle (corresponding to a loop line) between two among the three nodal lines was maximized at 90.85 kHz. As a result, it was found that the resonance frequency $f_B$ in the vibration mode B of the vibrator E was 90.85 kHz.

From the results thus obtained, it was found that the difference between the resonance frequency $f_A$ in the vibration mode A and the resonance frequency $f_B$ in the vibration mode B was given as $f_B-f_A=3.05$ (kHz).

Moreover, as a result of superimposing the two nodal lines in the vibration mode A generated when the phase difference between V1 and V2 was set to 0° with the three nodal lines in the vibration mode B generated when the phase difference between V1 and V2 was set to 180°, the two nodal lines intersected the three nodal lines.

Examples 2 to 9

Vibrators F to M were obtained through the same steps as those in EXAMPLE 1 except for shaping the piezoelectric ceramic to have individual thicknesses $t_c$, lengths of short sides, and lengths of long sides $l_c$, listed in Table 1 given below, by grinding and polishing processing.

Subsequently, vibration wave drive devices F to M each being such as illustrated in FIG. 5 were fabricated by connecting the voltage applying devices to the vibrators F to M through the power supply members.

The AC voltages V1 and V2 (each having the amplitude of 10 Vpp) were applied to each of the vibration wave drive devices F to M through the drive phase electrodes. In that state, while changing frequency from 1 kHz to 150 kHz, an in-plane distribution of displacements in each of the vibrators F to M in the out-of-plane direction was measured at each frequency with the laser Doppler vibration meter. First, when the phase difference between V1 and V2 was set to 0°, the vibration mode A with two nodal lines not intersecting each other was generated in each of the vibrators F to M, and the displacement at a position of the middle (corresponding to a loop line) between the two nodal lines was maximized at frequencies listed in Table 1. As a result, it was found that the resonance frequencies $f_A$ in the vibration mode A of the vibrators F to M were the frequencies listed in Table 1.

Furthermore, when the phase difference between V1 and V2 was set to 180°, the vibration mode B with three nodal lines being substantially perpendicular to the nodal lines in the vibration mode A and not intersecting one another was generated in each of the vibrators F to M, and the displacement at a position of the middle (corresponding to a loop line) between two among the three nodal lines was maximized at frequencies listed in Table 1. As a result, it was found that the resonance frequencies $f_B$ in the vibration mode B of the vibrators F to M were the frequencies listed in Table 1.

From the results thus obtained, it was found that the differences between the resonance frequencies $f_A$ in the vibration mode A and the resonance frequencies $f_B$ in the vibration mode B were given as individual values of $f_B-f_A$ (kHz) listed in Table 1.

Moreover, as a result of superimposing the two nodal lines in the vibration mode A generated when the phase difference between V1 and V2 was set to 0° with the three nodal lines in the vibration mode B generated when the phase difference between V1 and V2 was set to 180°, the two nodal lines intersected the three nodal lines in each of the vibrators F to M.

TABLE 1

| | Composition of Piezoelectric Ceramic | Young's Modulus at Room Temperature (25°) (GPa) | Long Side $I_c$ of Piezoelectric Ceramic (mm) | Long Side $I_p$ of Vibration Plate (mm) | $100 \times I_c/I_p$ (%) |
|---|---|---|---|---|---|
| EXAMPLE 1 | $(Ba_{0.85}Ca_{0.15})_{0.989}(Ti_{0.93}Zr_{0.07})O_3$ + $Mn 0.16$ wt % + $Bi 0.28$ wt % | 125 | 8.3 | 9.0 | 92.2 |
| EXAMPLE 2 | ↑ | 125 | 8.3 | 9.0 | 92.2 |
| EXAMPLE 3 | ↑ | 125 | 8.5 | 9.0 | 94.4 |
| EXAMPLE 4 | ↑ | 125 | 8.6 | 9.0 | 95.6 |
| EXAMPLE 5 | ↑ | 125 | 8.5 | 9.0 | 94.4 |
| EXAMPLE 6 | ↑ | 125 | 8.3 | 9.0 | 92.2 |
| EXAMPLE 7 | ↑ | 125 | 8.9 | 9.0 | 98.9 |
| EXAMPLE 8 | ↑ | 125 | 8.7 | 9.0 | 96.7 |
| EXAMPLE 9 | ↑ | 125 | 8.3 | 9.0 | 92.2 |
| EXAMPLE 10 | $(Na_{0.88}Ba_{0.12})(Nb_{0.88}Ti_{0.12})O_3$ + $Mn 0.032$ wt % | 125 | 8.3 | 9.0 | 92.2 |
| EXAMPLE 11 | $(Ba_{0.90}, Ca_{0.10})TiO_3$ + $Mn 0.12$ wt % | 132 | 8.3 | 9.0 | 92.2 |
| COMPARATIVE EXAMPLE 1 | $BaTiO_3$ + $Mn 0.12$ wt % | 130 | 8.9 | 9.0 | 98.9 |
| COMPARATIVE EXAMPLE 2 | ↑ | 130 | 8.8 | 9.0 | 97.8 |

| | Thickness $t_c$ of Piezoelectric Ceramic (mm) | Length of Short Side of Piezoelectric Ceramic (mm) | | | $f_A$ (kHz) | $f_B$ (kHz) | $f_B - f_A$ (kHz) |
|---|---|---|---|---|---|---|---|
| EXAMPLE 1 | 0.30 | 5.70 | Piezoelectric Vibrator E | Vibration Wave Drive Device E | 87.80 | 90.85 | 3.05 |
| EXAMPLE 2 | 0.35 | 5.70 | Piezoelectric Vibrator F | Vibration Wave Drive Device F | 94.25 | 96.76 | 2.51 |

TABLE 1-continued

| EXAMPLE 3 | 0.30 | 5.70 | Piezoelectric Vibrator G | Vibration Wave Drive Device G | 88.10 | 90.57 | 2.47 |
|---|---|---|---|---|---|---|---|
| EXAMPLE 4 | 0.30 | 5.70 | Piezoelectric Vibrator H | Vibration Wave Drive Device H | 88.33 | 90.62 | 2.29 |
| EXAMPLE 5 | 0.35 | 5.70 | Piezoelectric Vibrator I | Vibration Wave Drive Device I | 94.50 | 96.73 | 2.23 |
| EXAMPLE 6 | 0.40 | 5.70 | Piezoelectric Vibrator J | Vibration Wave Drive Device J | 100.52 | 102.62 | 2.10 |
| EXAMPLE 7 | 0.30 | 5.70 | Piezoelectric Vibrator K | Vibration Wave Drive Device K | 88.40 | 90.41 | 2.01 |
| EXAMPLE 8 | 0.40 | 5.80 | Piezoelectric Vibrator L | Vibration Wave Drive Device L | 100.10 | 102.13 | 2.03 |
| EXAMPLE 9 | 0.30 | 5.80 | Piezoelectric Vibrator M | Vibration Wave Drive Device M | 87.00 | 91.04 | 4.04 |
| EXAMPLE 10 | 0.30 | 5.70 | Piezoelectric Vibrator N | Vibration Wave Drive Device N | 88.45 | 90.55 | 2.10 |
| EXAMPLE 11 | 0.30 | 5.70 | Piezoelectric Vibrator O | Vibration Wave Drive Device O | 90.05 | 92.26 | 2.21 |
| COMPARATIVE EXAMPLE 1 | 0.40 | 5.70 | Piezoelectric Vibrator P | Vibration Wave Drive Device P | 109.10 | 109.10 | 0.00 |
| COMPARATIVE EXAMPLE 2 | 0.40 | 5.70 | Piezoelectric Vibrator Q | Vibration Wave Drive Device Q | 110.25 | 110.75 | 0.50 |

Example 10

In EXAMPLE 10, sodium niobate, barium titanate, and trimanganese tetroxide were used as raw material powders, and were mixed together such that Na, Ba, Nb, Ti and Mn formed a composition containing 0.032 weight part of Mn with respect to $(Na_{0.88}Ba_{0.12})(Nb_{0.88}Ti_{0.12})O_3$. The mixed powders were fired for 5 hours at maximum temperature of 1150° C.

As a result of measuring a composition of the piezoelectric ceramic by an ICP atomic emission spectroscopy, 0.032 weight part of Mn in terms of metal was contained with respect to 100 weight parts of $(Na_{0.88}Ba_{0.12})(Nb_{0.88}Ti_{0.12})O_3$, and the content of lead was less than 200 ppm. As a result of analyzing a crystal structure of the piezoelectric ceramic by the X-ray diffraction (XRD) measurement, it was found that the crystal structure was the perovskite structure. Moreover, as a result of measuring a density of the piezoelectric ceramic by the Archimedes' method, the density was $4.5 \times 10^3$ kg/m³.

Then, the piezoelectric ceramic was worked into dimensions of 10×2.5×0.5 mm³ to measure various parameters of the piezoelectric ceramic. A test piece of piezoelectric element was fabricated by coating silver pastes over two surfaces (10×2.5 mm²) of the piezoelectric ceramic with screen printing. The silver pastes were baked by holding the test piece at 800° C. for 10 minutes. Then, the fabricated test piece of piezoelectric element was subjected to the polarization treatment on conditions of temperature of 100° C., electric field of 1 kV/mm, and time of 30 minutes. As a result of evaluating the test piece of piezoelectric element at the room temperature (25° C.) by the resonance-anti-resonance method, the Young's modulus Yp was 125 GPa, and the piezoelectric constant $d_{31}$ was −60 pm/V.

The vibrator N was obtained through similar steps to those in EXAMPLE 1 except for using the piezoelectric ceramic having the above-described composition.

Subsequently, the vibration wave drive device N such as illustrated in FIG. 5 was fabricated by connecting the voltage applying devices to the vibrator N through the power supply member.

The AC voltages V1 and V2 (each having the amplitude of 10 Vpp) were applied to the vibration wave drive device N through the drive phase electrodes. In that state, while changing frequency from 1 kHz to 150 kHz, an in-plane distribution of displacements of the vibrator N in the out-of-plane direction was measured at each frequency with the laser Doppler vibration meter. First, when the phase difference between V1 and V2 was set to 0°, the vibration mode A with two nodal lines not intersecting each other was generated in the vibrator N, and the displacement at a position of the middle (corresponding to a loop line) between the two nodal lines was maximized at 88.4 kHz. As a result, it was found that the resonance frequency $f_A$ in the vibration mode A of the vibrator N was 88.4 kHz.

Next, when the phase difference between V1 and V2 was set to 180°, the vibration mode B with three nodal lines being substantially perpendicular to the nodal lines in the vibration mode A and not intersecting one another was generated in the vibrator N, and the displacement at a position of the middle (corresponding to a loop line) between two among the three nodal lines was maximized at 90.5 kHz. As a result, it was found that the resonance frequency $f_B$ in the vibration mode B of the vibrator N was 90.5 kHz.

From the results thus obtained, it was found that the difference between the resonance frequency $f_A$ in the vibration mode A and the resonance frequency $f_B$ in the vibration mode B was given as $f_B - f_A = 2.1$ (kHz).

Moreover, as a result of superimposing the two nodal lines in the vibration mode A generated when the phase difference between V1 and V2 was set to 0° with the three nodal lines in the vibration mode B generated when the phase difference between V1 and V2 was set to 180°, the two nodal lines intersected the three nodal lines.

Example 11

In EXAMPLE 11, a piezoelectric ceramic was obtained by firing metal oxide powders having a different composition from that in EXAMPLE 1. As a result of measuring a composition of the piezoelectric ceramic by the X-ray fluorescence (XRF) analysis, 0.12 weight part of Mn in terms of metal was contained with respect to 100 weight parts of $(Ba_{0.90}Ca_{0.10})TiO_3$, and the content of lead was less than 200 ppm. As a result of analyzing a crystal structure of the piezoelectric ceramic by the X-ray diffraction (XRD) measurement, it was found that the crystal structure was the perovskite structure. Thus, the piezoelectric ceramic contained a perovskite metal oxide made of a barium titanate substitute. Moreover, as a result of measuring a density of the piezoelectric ceramic by the Archimedes' method, the density was $5.6 \times 10^3$ kg/m$^3$.

Then, the piezoelectric ceramic was worked into dimensions of $10 \times 2.5 \times 0.5$ mm$^3$ to measure various parameters of the piezoelectric ceramic. A test piece of piezoelectric element was fabricated by coating silver pastes over two surfaces ($10 \times 2.5$ mm$^2$) of the piezoelectric ceramic with screen printing. The silver pastes were baked by holding the test piece at 800° C. for 10 minutes. Then, the fabricated test piece of piezoelectric element was subjected to the polarization treatment on conditions of temperature of 100° C., electric field of 1 kV/mm, and time of 30 minutes. As a result of evaluating the test piece of piezoelectric element at the room temperature (25° C.) by the resonance-anti-resonance method, the Young's modulus Yp was 132 GPa, and the piezoelectric constant $d_{31}$ was −75 pm/V.

The vibrator O was obtained through similar steps to those in EXAMPLE 1 except for using the piezoelectric ceramic having the above-described composition.

Subsequently, the vibration wave drive device O such as illustrated in FIG. 5 was fabricated by connecting the voltage applying devices to the vibrator O through the power supply member.

The AC voltages V1 and V2 (each having the amplitude of 10 Vpp) were applied to the vibration wave drive device O through the drive phase electrodes. In that state, while changing frequency from 1 kHz to 150 kHz, an in-plane distribution of displacements of the vibrator O in the out-of-plane direction was measured at each frequency with the laser Doppler vibration meter. First, when the phase difference between V1 and V2 was set to 0°, the vibration mode A with two nodal lines not intersecting each other was generated in the vibrator O. and the displacement at a position of the middle (corresponding to a loop line) between the two nodal lines was maximized at 90.0 kHz. As a result, it was found that the resonance frequency $f_A$ in the vibration mode A of the vibrator O was 90.0 kHz.

Next, when the phase difference between V1 and V2 was set to 180°, the vibration mode B with three nodal lines being substantially perpendicular to the nodal lines in the vibration mode A and not intersecting one another was generated in the vibrator O, and the displacement at a position of the middle (corresponding to a loop line) between two among the three nodal lines was maximized at 92.2 kHz. As a result, it was found that the resonance frequency $f_B$ in the vibration mode B of the vibrator O was 92.2 kHz.

From the results thus obtained, it was found that the difference between the resonance frequency $f_A$ in the vibration mode A and the resonance frequency $f_B$ in the vibration mode B was given as $f_B - f_A = 2.2$ (kHz).

Moreover, as a result of superimposing the two nodal lines in the vibration mode A generated when the phase difference between V1 and V2 was set to 0° with the three nodal lines in the vibration mode B generated when the phase difference between V1 and V2 was set to 180°, the two nodal lines intersected the three nodal lines.

Comparative Example 1

For comparison with the present invention, a piezoelectric ceramic was fabricated through the following procedures.

First, a piezoelectric ceramic was obtained by firing metal oxide powders having a different composition from that in EXAMPLE 1. As a result of measuring a composition of the piezoelectric ceramic by the X-ray fluorescence (XRF) analysis, 0.12 weight part of Mn in terms of metal was contained with respect to 100 weight parts of $BaTiO_3$, and the content of lead was less than 200 ppm. As a result of analyzing a crystal structure of the piezoelectric ceramic by the X-ray diffraction (XRD) measurement, it was found that the crystal structure was the perovskite structure. Thus, the piezoelectric ceramic contained a non-lead-based perovskite metal oxide. Moreover, as a result of measuring a density of the piezoelectric ceramic by the Archimedes' method, the density was $6.0 \times 10^3$ kg/m$^3$.

Then, the piezoelectric ceramic was worked into dimensions of $10 \times 2.5 \times 0.5$ mm$^3$ to measure various parameters of the piezoelectric ceramic. A test piece of piezoelectric element was fabricated by coating silver pastes over two surfaces ($10 \times 2.5$ mm$^2$) of the piezoelectric ceramic with screen printing. The silver pastes were baked by holding the test piece at 800° C. for 10 minutes. Then, the fabricated test piece of piezoelectric element was subjected to the polarization treatment on conditions of temperature of 100° C., electric field of 1 kV/mm, and time of 30 minutes. As a result of evaluating the test piece of piezoelectric element at the room temperature (25° C.) by the resonance-anti-resonance method, the Young's modulus Yp was 130 GPa, and the piezoelectric constant $d_{31}$ was −85 pm/V.

After grinding and polishing the piezoelectric ceramic into a thickness of 0.40 mm, the piezoelectric ceramic was cut into a size of $8.9 \times 5.7$ mm$^2$, and one piece of the piezoelectric ceramic having a rectangular parallelepiped shape was obtained. The drive phase electrodes and the ground electrodes were formed on opposite surfaces of the one piece of piezoelectric ceramic with screen printing using silver pastes. A coupling electrode was formed on a lateral surface of the piezoelectric ceramic to establish electrical conduction between the ground electrodes formed on the opposite surfaces of the piezoelectric ceramic, whereby the piezoelectric element was obtained. A silver paste was used to form the coupling electrode. The silver paste was baked by holding the piezoelectric element at 800° C. for 10 minutes.

A vibrator P was obtained through similar steps to those in EXAMPLE 1 except for using the piezoelectric element having the above-described composition.

Subsequently, a vibration wave drive device P such as illustrated in FIG. 5 was fabricated by connecting the voltage applying devices to the vibrator P through the power supply member.

The AC voltages V1 and V2 (each having the amplitude of 10 Vpp) were applied to the vibration wave drive device P through the drive phase electrodes. In that state, while changing frequency from 1 kHz to 150 kHz, an in-plane distribution of displacements of the vibrator P in the out-of-plane direction was measured at each frequency with the laser Doppler vibration meter. First, when the phase difference between V1 and V2 was set to 0°, the vibration mode A with two nodal lines not intersecting each other was generated in the vibrator P, and the displacement at a position of the middle (corresponding to a loop line) between the two nodal lines was maximized at 109.10 kHz. As a result, it was found that the resonance frequency $f_A$ in the vibration mode A of the vibrator P was 109.10 kHz.

Next, when the phase difference between V1 and V2 was set to 180°, the vibration mode B with three nodal lines being substantially perpendicular to the nodal lines in the vibration mode A and not intersecting one another was generated in the vibrator P, and the displacement at a position of the middle (corresponding to a loop line) between two among the three nodal lines was maximized at 109.10 kHz. As a result, it was found that the resonance frequency $f_B$ in the vibration mode B of the vibrator P was 109.10 kHz.

From the results thus obtained, it was found that the difference between the resonance frequency $f_A$ in the vibration mode A and the resonance frequency $f_B$ in the vibration mode B was given as $f_B-f_A=0.00$ (kHz).

Moreover, as a result of superimposing the two nodal lines in the vibration mode A generated when the phase difference between V1 and V2 was set to 0° with the three nodal lines in the vibration mode B generated when the phase difference between V1 and V2 was set to 180°, the two nodal lines intersected the three nodal lines.

Comparative Example 2

In COMPARATIVE EXAMPLE 2, a vibrator Q was obtained through similar steps to those in COMPARATIVE EXAMPLE 1 except for working the piezoelectric ceramic into a shape with a thickness of 0.4 mm and a long side of 8.8 mm by grinding and polishing processing.

Subsequently, a vibration wave drive device Q such as illustrated in FIG. 5 was fabricated by connecting the voltage applying devices to the vibrator Q through the power supply member.

The AC voltages V1 and V2 (each having the amplitude of 10 Vpp) were applied to the vibration wave drive device Q through the drive phase electrodes. In that state, while changing frequency from 1 kHz to 150 kHz, an in-plane distribution of displacements of the vibrator Q in the out-of-plane direction was measured at each frequency with the laser Doppler vibration meter. First, when the phase difference between V1 and V2 was set to 0°, the vibration mode A with two nodal lines not intersecting each other was generated in the vibrator Q, and the displacement at a position of the middle (corresponding to a loop line) between the two nodal lines was maximized at 110.25 kHz. As a result, it was found that the resonance frequency $f_A$ in the vibration mode A of the vibrator Q was 110.25 kHz.

Next, when the phase difference between V1 and V2 was set to 180°, the vibration mode B with three nodal lines being substantially perpendicular to the nodal lines in the vibration mode A and not intersecting one another was generated in the vibrator Q, and the displacement at a position of the middle (corresponding to a loop line) between two among the three nodal lines was maximized at 110.75 kHz. As a result, it was found that the resonance frequency $f_B$ in the vibration mode B of the vibrator Q was 110.75 kHz.

From the results thus obtained, it was found that the difference between the resonance frequency $f_A$ in the vibration mode A and the resonance frequency $f_B$ in the vibration mode B was given as $f_B-f_A=0.50$ (kHz).

Moreover, as a result of superimposing the two nodal lines in the vibration mode A generated when the phase difference between V1 and V2 was set to 0° with the three nodal lines in the vibration mode B generated when the phase difference between V1 and V2 was set to 180°, the two nodal lines intersected the three nodal lines.

Vibration Wave Motors Using Vibrators of Examples 1 to 11

Next, a vibration wave motor such as illustrated in FIG. 6 was fabricated by disposing the elastic body in each of the vibrators E to O, fabricated in EXAMPLES 1 to 11, to be held in contact with the moving body (slider).

The AC voltages V1 and V2 (each having the amplitude of 100 Vpp) were applied to the fabricated vibration wave motor through the drive phase electrodes. At that time, the phase difference θ between V1 and V2 was set to 900, and the drive frequency was swept from $(f_B+5)$ kHz to $(f_B-5)$ kHz to reciprocate the vibrator in the directions denoted by the arrows in FIG. 6. Table 2 lists the results of evaluating a maximum speed and power consumption at a constant speed (0.2 m/s) on the above-described condition.

Vibration Wave Motors Using Vibrators of Comparative Examples 1 and 2

A vibration wave motor such as illustrated in FIG. 6 was fabricated through similar steps by employing each of the vibrators P and Q fabricated in COMPARATIVE EXAMPLE 1 and 2. The vibration wave motor was then driven and evaluated. Table 2 further lists the results of evaluating a maximum speed and power consumption in those cases.

TABLE 2

| | | | Maximum Speed (m/s) | Power Consumption at 0.2 m/s (W) |
|---|---|---|---|---|
| EXAMPLE 1 | Piezoelectric Vibrator E | Vibration Wave Motor E | 0.61 | 0.30 |
| EXAMPLE 2 | Piezoelectric Vibrator F | Vibration Wave Motor F | 0.58 | 0.31 |
| EXAMPLE 3 | Piezoelectric Vibrator G | Vibration Wave Motor G | 0.58 | 0.31 |
| EXAMPLE 4 | Piezoelectric Vibrator H | Vibration Wave Motor H | 0.55 | 0.33 |
| EXAMPLE 5 | Piezoelectric Vibrator I | Vibration Wave Motor I | 0.55 | 0.34 |
| EXAMPLE 6 | Piezoelectric Vibrator J | Vibration Wave Motor J | 0.54 | 0.32 |
| EXAMPLE 7 | Piezoelectric Vibrator K | Vibration Wave Motor K | 0.50 | 0.45 |
| EXAMPLE 8 | Piezoelectric Vibrator L | Vibration Wave Motor L | 0.51 | 0.46 |
| EXAMPLE 9 | Piezoelectric Vibrator M | Vibration Wave Motor M | 0.61 | 0.30 |
| EXAMPLE 10 | Piezoelectric Vibrator N | Vibration Wave Motor N | 0.55 | 0.33 |
| EXAMPLE 11 | Piezoelectric Vibrator O | Vibration Wave Motor O | 0.55 | 0.33 |
| COMPARATIVE EXAMPLE 1 | Piezoelectric Vibrator P | Vibration Wave Motor P | 0.30 | 1.20 |
| COMPARATIVE EXAMPLE 2 | Piezoelectric Vibrator Q | Vibration Wave Motor Q | 0.28 | 0.98 |

As seen from Table 2, in the vibration wave motors of EXAMPLES 12, the maximum speed was high and the power consumption was low. Thus, satisfactory values were obtained for both the maximum speed and the power consumption.

On the other hand, in the vibration wave motors of COMPARATIVE EXAMPLES 1 and 2, the maximum speed was reduced almost by half and the power consumption was increased twice or more in comparison with those in EXAMPLES 1 to 11. Thus, the power consumption (i.e., the input power at 0.2 m/s) was very large.

Method of Manufacturing Optical Device

Example 12 and Comparative Example 3

An optical device such as illustrated in FIG. 7 was fabricated as EXAMPLE 12 by dynamically connecting the vibration wave drive device, fabricated in EXAMPLE 1, to an optical member. Furthermore, an optical device such as illustrated in FIG. 7 was fabricated as COMPARATIVE EXAMPLE 3 by dynamically connecting the vibration wave drive device, fabricated in COMPARATIVE EXAMPLE 1, to an optical member. An auto-focusing operation corresponding to application of the AC voltages was confirmed in each of the optical devices, but a focusing time of the auto-focusing operation was shorter in EXAMPLE 12 than in COMPARATIVE EXAMPLE 3.

Electronical Device

When the above-described vibrator was mounted in combination with an electronical device, good vibration characteristics were obtained. Furthermore, when the above-described vibration wave drive device was mounted in combination with an electronical device, good driving characteristics were obtained with the electronical device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-254371, filed Dec. 27, 2016 and No. 2017-236227 filed Dec. 8, 2017, which is hereby incorporated by reference herein in its entirety.

The invention claimed is:

1. A vibrator comprising:
a piezoelectric element including a piezoelectric material and electrodes; and
an elastic body,
wherein a Pb component contained in the piezoelectric material is less than 1000 ppm, and
a resonance frequency $f_A$ of the vibrator in an out-of-plane vibration mode A and a resonance frequency $f_B$ of the vibrator in an out-of-plane vibration mode B satisfy a relation of an absolute value of $(f_B-f_A)>2$ kHz, the vibration mode A generating first vibration waves in the elastic body and the vibration mode B generating second vibration waves in the elastic body,
wherein wave fronts of the first vibration waves and the second vibration waves intersect each other.

2. The vibrator according to claim 1, wherein Young's modulus of the piezoelectric material at a room temperature is not less than 100 GPa and not more than 145 GPa.

3. The vibrator according to claim 1, wherein the elastic body includes a vibration plate and a support member, and a length of a long side $l_c$ of the piezoelectric material falls within a range of 92% to 96% of a length of a long side $l_p$ of the vibration plate.

4. The vibrator according to claim 1, wherein a thickness $t_c$ and a long side $l_c$ of the piezoelectric material satisfy a relation of $t_c$ being greater than or equal to 0.250 (mm) and smaller than or equal to $-0.25 \times l_c + 2.475$ mm.

5. The vibrator according to claim 1, wherein the piezoelectric material is one of piezoelectric ceramics containing barium titanate series, bismuth sodium titanate series, niobate series, or bismuth ferrate series as main components or in composite forms.

6. The vibrator according to claim 1, wherein the piezoelectric material contains, as a main component, a perovskite oxide expressed by following general formula (1), and content of components contained in the piezoelectric material other than the main component is not more than 1 weight part in terms of metal with respect to 100 weight parts of the oxide:

$$(Ba_{1-x}Ca_x)_\alpha(Ti_{1-y}Zr_y)O_3 \qquad (1)$$

where α is greater than or equal to 0.986 and smaller than or equal to 1.100, x is greater than or equal to 0.02 and smaller than or equal to 0.30, and y is greater than or equal to 0 and smaller than or equal to 0.095.

7. The vibrator according to claim 1, wherein the vibration plate and the support member are formed integrally with each other.

8. A vibration wave drive device comprising the vibrator according to claim 1, and a power supply member.

9. A vibration wave motor comprising the vibration wave drive device according to claim 8, and a moving body disposed in contact with the elastic body of the vibrator constituting the vibration wave drive device.

10. An optical device comprising the vibration wave motor according to claim 9, and an optical member disposed to be movable by the vibration wave motor.

11. An electronical device comprising the vibrator according to claim 1, or the vibration wave drive device according to claim 8.

* * * * *